(12) United States Patent
Rose et al.

(10) Patent No.: US 9,195,675 B2
(45) Date of Patent: Nov. 24, 2015

(54) DECODING OF VARIABLE-LENGTH DATA WITH GROUP FORMATS

(75) Inventors: Daniel E. Rose, Cupertino, CA (US); Alexander A. Stepanov, Palo Alto, CA (US); Anil Ramesh Gangolli, Palo Alto, CA (US); Paramjit S. Oberoi, Mountain View, CA (US); Ryan Jacob Ernst, Sunnyvale, CA (US)

(73) Assignee: A9.com, Inc., Palo Alto, CA (US)

( * ) Notice: Subject to any disclaimer, the term of this patent is extended or adjusted under 35 U.S.C. 154(b) by 553 days.

(21) Appl. No.: 13/077,417

(22) Filed: Mar. 31, 2011

(65) Prior Publication Data

US 2012/0221539 A1  Aug. 30, 2012

Related U.S. Application Data

(60) Provisional application No. 61/446,364, filed on Feb. 24, 2011.

(51) Int. Cl.
*G06F 7/00* (2006.01)
*G06F 17/30* (2006.01)
*H03M 7/40* (2006.01)
*H03M 7/46* (2006.01)

(52) U.S. Cl.
CPC ...... *G06F 17/30168* (2013.01); *G06F 17/3023* (2013.01); *G06F 17/30221* (2013.01); *H03M 7/40* (2013.01); *H03M 7/46* (2013.01)

(58) Field of Classification Search
None
See application file for complete search history.

(56) References Cited

U.S. PATENT DOCUMENTS

| 5,926,644 | A | * | 7/1999 | Hays | 712/22 |
|---|---|---|---|---|---|
| 7,319,994 | B1 | | 1/2008 | Sercinoglu | |
| 2002/0105955 | A1 | * | 8/2002 | Roberts et al. | 370/401 |
| 2003/0088823 | A1 | * | 5/2003 | Miyauchi et al. | 714/795 |
| 2004/0073541 | A1 | * | 4/2004 | Lindblad et al. | 707/3 |
| 2006/0293899 | A1 | * | 12/2006 | Church et al. | 704/275 |
| 2007/0005911 | A1 | * | 1/2007 | Yang et al. | 711/154 |
| 2008/0048893 | A1 | | 2/2008 | Xu | |
| 2008/0082554 | A1 | | 4/2008 | Pedersen | |
| 2009/0210412 | A1 | * | 8/2009 | Oliver et al. | 707/5 |

(Continued)

FOREIGN PATENT DOCUMENTS

| CN | 103582883 A | 2/2014 |
|---|---|---|
| JP | 2014-507732 | 3/2014 |
| WO | 2012/116086 | 8/2012 |

OTHER PUBLICATIONS

"International Search Report dated May 29, 2012", International Application No. PCT/US12/26152, May 29, 2012, 8 pages.

(Continued)

*Primary Examiner* — Hosain Alam
*Assistant Examiner* — Thu Nga Nguyen
(74) *Attorney, Agent, or Firm* — Hogan Lovells US LLP

(57) ABSTRACT

Embodiments provide methods and systems for encoding and decoding variable-length data, which may include methods for encoding and decoding search engine posting lists. Embodiments may include different encoding formats including group unary, packed unary, and/or packed binary formats. Some embodiments may utilize single instruction multiple data (SIMD) instructions that may perform a parallel shuffle operation on encoded data as part of the decoding processes. Some embodiments may utilize lookup tables to determine shuffle sequences and/or masks and/or shifts to be utilized in the decoding processes. Some embodiments may utilize hybrid formats.

21 Claims, 31 Drawing Sheets

(56) References Cited

U.S. PATENT DOCUMENTS

| | | |
|---|---|---|
| 2009/0313238 A1 | 12/2009 | Merrigan |
| 2009/0319549 A1 | 12/2009 | Millett |
| 2010/0039301 A1 | 2/2010 | Hagiya |
| 2010/0057810 A1 | 3/2010 | Ei et al. |
| 2010/0125614 A1 | 5/2010 | D'Urso |
| 2010/0141489 A1 | 6/2010 | Reznik |
| 2011/0016096 A1 | 1/2011 | Teerlink |

OTHER PUBLICATIONS

"Non-Final Office Action" dated Jan. 16, 2014; U.S. Appl. No. 13/077,479; 47 pages.

"International Preliminary Report on Patentability dated Aug. 27, 2013", International Application No. PCT/US/2012/026152, Aug. 27, 2013, 6 pages.

EP Supplementary Search Report and Search Opinion mailed Jul. 31, 2014, for European Patent Application No. EP12749564, 8 pages.

JP First Office Action mailed Sep. 30, 2014, for Japanese Patent Application No. 2013-555526, 4 pages.

Final Office Action dated Aug. 27, 2014; for U.S. Appl. No. 13/077,479 (37 pages).

Non Final Office Action dated Jan. 7, 2015; for U.S. Appl. No. 13/077,479 (35 pages).

* cited by examiner

- Fill complete data block, even if final integer does not fully fit.
- Data may continue into next data block
- Corresponding descriptor then continues into next descriptor.
- G8CU – stands for Grouped 8-byte Complete blocks with Unary descriptor Example: Encode 4 integers 0xAAAA, 0xBBBBBB, 0xCC, 0xDDDDDDD.
Byte counts are 2, 3, 1, 4. Last integer overflows into next block.

| i (1110) | shf (1120) | src (1130) | dst (1140) |
|---|---|---|---|
| 0 | 0 | AA AA | AA AA |
| 1 | 1 | BB AA | AA AA |
| 2 | -1 | BB BB | 00 00 |
| 3 | -1 | BB BB | 00 00 |
| 4 | 2 | BB BB | BB BB |
| 5 | 3 | CC BB | BB BB |
| 6 | 4 | 00 CC | BB BB |
| 7 | -1 | 00 00 | CC 00 |
| 8 | 5 | 00 CC | CC 00 |
| 9 | -1 | | 00 00 |
| 10 | -1 | | 00 00 |
| 11 | -1 | | 00 00 |
| 12 | -1 | | 00 00 |
| 13 | -1 | | 00 00 |
| 14 | -1 | | 00 00 |
| 15 | -1 | | 00 00 |

Output offset is 3

FIG. 11

Example storing sequence of 16 ones (b = 8).

Example of storing a run of 300 ones in RV format.
Note that the 2nd and 3rd bytes represent the quantity 297
in varint-SU format.

DECODING OF VARIABLE-LENGTH DATA WITH GROUP FORMATS

BACKGROUND

A typical search engine indexing algorithm utilizes an inverted index data structure. This is conceptually similar to the index in the back of a book; it is an index data structure mapping content, such as a list of words, to its location in a document (or set of documents). In the context of a search engine, the documents are commonly web pages, e-mail messages, and the like. The occurrence of a word in a document may be called a posting, and the list of all documents containing a word may be called a posting list. Just as a book index entry lists page numbers, a posting list may contain document identification numbers (docIDs). When a search engine receives a query, it can look up the posting list for each word in the query and combines the results. In order to combine the results efficiently, the postings may be stored in order of their docIDs.

It may be desirable to store posting lists in as little space as possible. By using the differences between adjacent docIDs rather than the docIDs themselves, the postings can contain smaller numbers. There are numerous other examples, from general databases to the MIDI specification, where data might be coded more compactly and then decoded at a later point, where often the decoding happens repeatedly based on when the data may be needed. There are a variety of techniques developed for storing data in less space. However, the methods may have deficiencies including speed limitations or storage efficiency limitations.

BRIEF DESCRIPTION OF THE DRAWINGS

Various embodiments in accordance with the present disclosure will be described with reference to the drawings, in which:

FIG. 11 illustrates a parallel shuffle operation that can be used in accordance with some embodiments;

DETAILED DESCRIPTION

Figure 1:
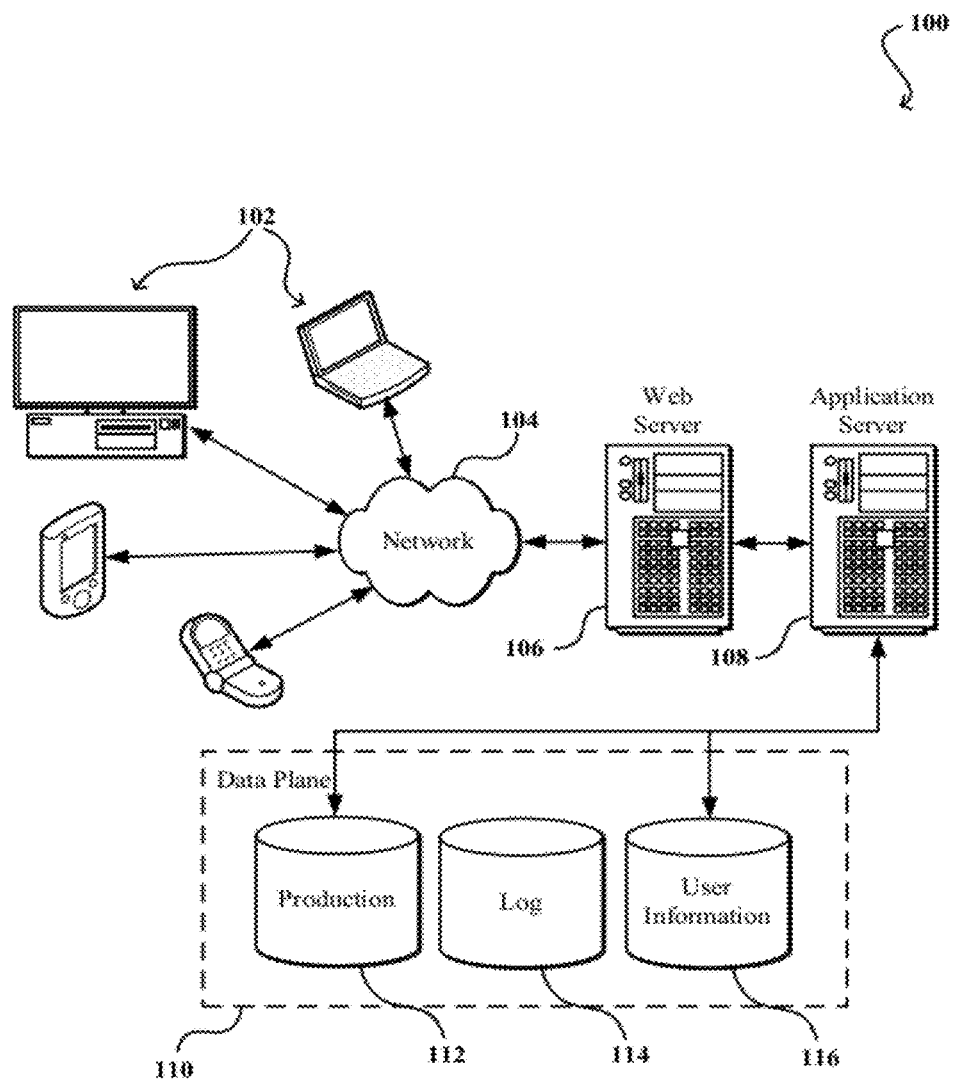
FIG. 1 illustrates an environment in which various embodiments can be implemented.

Systems and methods in accordance with various embodiments of the present disclosure may overcome one or more of the aforementioned and other deficiencies experienced in conventional approaches to encoding and decoding data sets. In particular, various approaches provide for improved encoding and/or decoding of data sets including sequences of integers, such as those encountered with search engine posting lists, for example.

Methods, systems, and/or devices are provided for decoding encoded document identification number differences in a search engine posting list utilizing parallel shuffle operations in accordance with various embodiments. In one embodiment, decoding encoded document identification number differences includes reading one or more descriptors. Each descriptor includes size information regarding a group of encoded document identification number differences. In some embodiments, encoded document identification number differences are encoded with a group unary format. Multiple data representing the group of encoded document identification number differences are read. The group of encoded document identification number differences is linked with the one or more descriptors. One or more shuffle sequences linked with the one or more descriptors from a lookup table are identified. One or more parallel shuffle operations are performed on the multiple data representing the group of encoded document identification number differences using the identified shuffle sequences. The one or more parallel shuffle operations include inserting one or more sequences of zeros into the multiple data. Multiple decoded document identification number differences from the shuffled multiple data representing the group of encoded document identification number differences are determined.

Methods, systems, and/or devices for decoding variable-length data are provided in accordance with various embodiments. In some embodiments, decoding variable-length data includes reading one or more blocks of data. Each block of data represents multiple encoded variable-length data. One or more descriptors linked with the one or more blocks of data are read. One or more shuffle sequences linked with the one or more descriptors are identified from a lookup table. One or more shuffle operations are performed on the one or more blocks of data using the one or more identified shuffle sequences. Multiple decoded variable-length data are determined from the shuffled one or more blocks of data.

In some embodiments, performing the one or more shuffle operations includes inserting one or more sequences of zeros into the shuffled one or more blocks of data to represent one or more portions of the one or more blocks of data in a standard format, such as a 32-bit representation of an integer. The one or more data blocks may represent multiple integers encoded in a variable-length representation. In some embodiments, the one or more data blocks may represent other data encoded in a variable-length representation.

Determining the multiple decoded variable-length data from the shuffled one or more blocks of data may also include determining a partial result from the shuffled one or more blocks of data. A remaining portion associated with the partial result may be determined from another block of data. Such embodiments may utilize complete block variations as discussed above. In some cases, the one or more shuffle operations may include one or more parallel shuffle instructions from a single instruction multiple data (SIMD) processor instruction set.

Some embodiments may include identifying one or more offsets linked with the one or more descriptors. The one or more offsets linked with the one or more descriptors may include an input offset with a fixed size; in some cases, the one or more offsets linked with the one or more descriptors may include an output offset with a variable size. The fixed size may depend on a number of bytes included in one or more blocks of data and the one or more descriptors. The one or more offsets linked with the one or more descriptors may include an input offset with a variable size. The variable size may depend on a number of data represented by the block of data. Some embodiments may also include identifying output offsets.

The technology described herein includes several variable-length encoding formats and decoding methods and systems that may enable the use of very fast decoding methods. In some cases, the formats also may enable greater data compression. Although embodiments may be utilized for search engine posting lists, the technology described herein can be used in other situations where it may be beneficial to store a list of numbers or other data sets compactly and decode them efficiently, such as with databases.

Embodiments may provide numerous advantages including, but not limited to, avoiding branches that may interfere with the effectiveness of deep pipelines in some processors that use deep pipelines. Embodiments may read and write data more often than would be done in traditional variable length encoding and decoding, including reading data unaligned in some cases (instead of on object size boundaries), rather than deciding how much may need to be read. Some embodiments may utilize precomputing possible decoding options and storing that information in one or more tables. Some embodiments may operate on many bytes in parallel using single instruction multiple data (SIMD) instructions. Some embodiments may utilize a SIMD instruction such as a shuffle instruction like packed shuffle bytes (PSHUFB). Some embodiments may utilize descriptor bits and/or descriptor bytes the include length information regarding the data.

Methods for decoding a standard format more efficiently are provided. The format may be referred to as varint-SU: it includes a variable-length integer encoding (varint) with a split (S) unary (U) representation of the length of the encoded integer. The method may utilize parallel processing for decoding this format, with a variation that works even if the compressed bytes may not be stored in the natural machine order. Embodiments may operate on a group of bytes of encoded data at one time. In one embodiment, a block of 8 bytes is operated on at one time. The method may include extracting or collecting descriptor bits, which may be continuation and termination bits, in parallel. In some embodiments, this extraction or collection process uses a packed move mask bytes (PMOVMSKB) instruction. The method may use the extracted bits as an offset into a table of precomputed shuffle sequences. A parallel permutation instruction, such as PSHUFB, may use the shuffle sequence to determine how to decode the data. A series of bit shift operations may be done to remove the original continuation and/or termination bits from the decoded data.

In some embodiments, encoding formats along with decoding methods are provided that involve a packed unary (PU) representation. This format may be referred to as varint-PU. In some instances, this may include moving the continuation and/or termination bits into a single descriptor that can be found in the first byte. This may allow the data bits to be stored contiguously in memory, which may make it possible to decode more efficiently.

In some embodiments, methods for decoding a group of encoded integers that are stored as a block are provided The format may include a group binary (GB) representation, which may be referred to as varint-GB in some embodiments. In some instances, this method may utilize a shuffle instruction, such as a PSHUFB instruction, to decode groups of data bytes in parallel. Shuffle sequences may be obtained from a table designated by the value of a descriptor byte.

In some embodiments, encoding formats and decoding methods for a groups of integers simultaneously are provided. This format, in some instances, may include a format that may include a group unary (GU) representation. For example, for a group of 8 byte integers (potentially incomplete), the format may be referred to as varint-G8IU with unary length encoding.

Another encoding format referred to herein is varint G8CU, which represents a group of 8 byte information (each complete) with unary length encoding. Varint-G8CU generally refers to an instance when an integer or data would not fit in the remaining space in a block during encoding. In that case, a first part of the data may be stored in the current data block, and the remaining part of the data may be carried over to be stored in the next block. Embodiments may include decoding methods that include tables that take into account the information about the carry between blocks.

In some embodiments, variations of the variable length encoding formats are provided that includes a hybrid that utilizes at least one of the above compression schemes along with a bit vector to save space. In some embodiments, the variable length encoding format may include a group unary format. Embodiments may include detecting if a sequence of upcoming integers or data to be encoded are very small, such that more than one of the integers or data may be encoded into one byte. These integers or data may be stored as a bit vector. For example, the nth bit may represent whether a document at position base+n is in a posting list. A special descriptor value may indicate whether the group of data bytes should be interpreted as using the one of the variable-length integer formats, or as a bit vector.

In some embodiments, variations of the variable length encoding formats are provided that include a hybrid of the compression scheme and run-length encoding to save space. Embodiments may encode a run of similar data, such as a run of all 1s, by storing the length of the run instead of the values themselves.

Embodiments that utilize one of the group formats may easily be extended to larger groups, and this might provide additional efficiency gains for processors that may provide wider parallelism (for example, a 256-bit registers).

FIG. 1 illustrates an example of an environment 100 for implementing aspects in accordance with various embodiments. As will be appreciated, although a Web-based environment is used for purposes of explanation, different environments may be used, as appropriate, to implement various embodiments. An electronic client device 102 can include any appropriate device operable to send and receive requests, messages, or information over an appropriate network 104 and convey information back to a user of the device. Examples of such client devices include personal computers, cell phones, handheld messaging devices, laptop computers, set-top boxes, personal data assistants, electronic book readers, and the like. The network can include any appropriate network, including an intranet, the Internet, a cellular network, a local area network, or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections, and combinations thereof. In this example, the network includes the Internet, as the environment includes a Web server 106 for receiving requests and serving content in response thereto, although for other networks an alternative device serving a similar purpose could be used as would be apparent to one of ordinary skill in the art. Some embodiments may utilize a single electronic client device 102.

The illustrative environment includes at least one application server 108 and a plurality of resources, servers, hosts, instances, routers, switches, data stores, and/or other such components defining what will be referred to herein as a data plane 110, although it should be understood that resources of this plane are not limited to storing and providing access to data. It should be understood that there can be several application servers, layers, or other elements, processes, or components, which may be chained or otherwise configured, which can interact to perform tasks such as obtaining data from an appropriate data store. As used herein the term "data store" refers to any device or combination of devices capable of storing, accessing, and retrieving data, which may include any combination and number of data servers, databases, data storage devices, and data storage media, in any standard, distributed, or clustered environment. The application server can include any appropriate hardware and software for integrating with the data store as needed to execute aspects of one or more applications for the client device, handling a majority of the data access and business logic for an application. The application server provides admission control services in cooperation with the data store, and is able to generate content such as text, graphics, audio, and/or video to be transferred to the user, which may be served to the user by the Web server in the form of HTML, XML, or another appropriate structured language in this example. In some embodiments, the Web server 106, application server 108 and similar components can be considered to be part of the data plane. The handling of all requests and responses, as well as the delivery of content between the client device 102 and the application server 108, can be handled by the Web server. It should be understood that the Web and application servers are not required and are merely example components, as structured code can be executed on any appropriate device or host machine as discussed elsewhere herein.

The data stores of the data plane 110 can include several separate data tables, databases, or other data storage mechanisms and media for storing data relating to a particular aspect. For example, the data plane illustrated includes mechanisms for storing production data 112 and user information 116, which can be used to serve content for the production side. The data plane also is shown to include a mechanism for storing log data 114, which can be used for purposes such as reporting and analysis. It should be understood that there can be many other aspects that may need to be stored in a data store, such as for page image information and access right information, which can be stored in any of the above listed mechanisms as appropriate or in additional mechanisms in the data plane 110. The data plane 110 is operable, through logic associated therewith, to receive instructions from the application server 108 and obtain, update, or otherwise process data, instructions, or other such information in response thereto. In one example, a user might submit a search request for a certain type of item. In this case, components of the data plane might access the user information to verify the identity of the user, and access the catalog detail information to obtain information about items of that type. The information then can be returned to the user, such as in a results listing on a Web page that the user is able to view via a browser on the user device 102. Information for a particular item of interest can be viewed in a dedicated page or window of the browser.

Each server typically will include an operating system that provides executable program instructions for the general administration and operation of that server, and typically will include a computer-readable medium storing instructions that, when executed by a processor of the server, enable the server to perform its intended functions. Suitable implementations for the operating system and general functionality of the servers are known or commercially available, and are readily implemented by persons having ordinary skill in the art, particularly in light of the disclosure herein.

The environment in one embodiment is a distributed computing environment utilizing several computer systems and components that are interconnected via communication links, using one or more computer networks or direct connections.

However, it will be appreciated by those of ordinary skill in the art that such a system could operate equally well in a system having fewer or a greater number of components than are illustrated in FIG. 1. Thus, the depiction of the system 100 in FIG. 1 should be taken as being illustrative in nature, and not limiting to the scope of the disclosure.

An environment such as that illustrated in FIG. 1 can be useful for various content providers or other such entities, wherein multiple hosts and various types of resources might be used to perform tasks such as serving content, authenticating users, allocating resources, or performing any of a number of other such tasks. Some of these hosts may be configured to offer similar functionality, while other servers might be configured to perform at least some different functions.

Embodiments provide a variety of methods of variable-length encoding. Some embodiments may include byte-oriented encodings. Byte-oriented encoding includes the following properties. All significant bits of the natural binary representation are preserved. Each byte contains bits from only one integer or data. Data bits within a single byte of the encoding preserve the ordering they had in the original data or integer. All bits from a single integer or data precede all bits from the next integer or next data.

Byte-oriented formats for encoding may vary along a variety of dimensions. For example, the length of the data or integer may be expressed in a binary or a unary representation. In some cases, the bits representing the length of the data or integer can be stored adjacent to the data bits of the corresponding integer or data so that some data bytes contain both data and length information. In some instances the bits representing the lengths of several integers or data can be grouped together into one or more bytes distinct from the bytes containing data bits.

In some embodiments, the bits of a unary or binary representation or format may be packed or grouped contiguously. The bits of a unary representation may also be split across the bytes of the encoded integer or data. In some cases, the binary representation may be split across the bytes of the encoded integer or data. In some embodiments, the set of bits used to represent the length of one or more encoded integers or data may be referred to as a descriptor, since it may describe how the data bits are organized. A descriptor may be located contiguous with the data bits. In some cases, a descriptor may be located non-contiguous with the data bits.

In some embodiments, each encoded integer or data may include at least one byte. Both binary and unary descriptors may represent the length n of the integer or data by recording the value n−1. This reduces the number of bits required to represent a given length. Alternatively, the length of the integer or data may include storing length as n, which may allow the length zero to represent an arbitrary constant with zero data bytes.

The aspects discussed above may be utilized to provide description for different byte-oriented encoding formats. These aspects may be used to encode formats for integers that can be encoded in four bytes or less. Some instances, however, may expand to cover encoding data in general. Furthermore, the encoding principles may also be utilized for examples where the data and/or integer may involve more than four bytes.

The following describes several different embodiments for different variable-length encodings. Additional embodiments may be constructed within the scope of this disclosure. In general, embodiments may include encoded values that may have different lengths. The lengths may be encoded in one or more descriptors. Two properties may be utilized to describe a descriptor for different encoding types. A first descriptor property may include an arrangement description. The arrangement description for a descriptor may be referred to as split, packed, or group. As mentioned above, a split descriptor may include distributing bits of the descriptor that provide length information among several bytes that also include information regarding one or more integers or data. A packed descriptor may refer to descriptor bits being packed together. In some embodiments, a packed descriptor may precede the encoding of respective integers or data. A group descriptor may include grouping together the descriptors for several integers or data.

A second descriptor property may include a length encoding description Some length encoding descriptions may be unary, utilizing individual bits, while some length encoding descriptions may be binary, utilizing two bits. Some embodiments may utilize more bits based on the length of an encoded integer or data of interest.

There are numerous variations of some of these formats that may be found in different embodiments. Bytes of the encoded data may be stored in little-endian or big-endian order, which is known in the art. Descriptor bits may be stored in the least significant (LS) or most significant bits (MSB). While these choices are sometimes described as arbitrary conventions, in practice there may be efficiency considerations that make certain variants attractive for certain machine architectures. For example, in a split unary representation (discussed below), representing termination as 0 in the most significant bit may allow the common case of a one-byte integer to be decoded without any shifts or masks. In other example, for packed representations, it may be beneficial to use the least-significant bits to benefit from unaligned loads, keeping the data bits together. While traditional decoding methods may run more efficiently when the representation preserves native byte ordering, the performance of the SIMD methods discussed below may not depend on the ordering. The following examples will generally involve little-endian order, however, big-endian order may be adapted from what is described. For example, with packed encodings (discussed below), descriptors may be stored in least significant bits and shift to get the data with little-endian machines. For big-endian machines, descriptors for packed encodings may be stored in the most significant bits and mask to get data. In addition, the sense of 1 and 0 in descriptor bits may be swapped in some embodiments.

Some embodiment may utilize unary representations for a descriptor. For the unary formats, a natural convention may be utilized where the quantity may be represented by the number of consecutive 1 bits, which may be referred to as continuation bits, followed by a terminating 0, which may be referred to as a terminating bit. Some embodiments may reverse this convention using consecutive 0 bits followed by a terminating 1. Utilizing the natural convention and starting from the least significant bit, for example, the bits 0111 may represent the number 3 in one embodiment.

In some embodiments, a split unary format may be viewed as representing the length of the encoded integer or data in the sequence of continuation and/or termination bits. The descriptor bits may be viewed as distributed continuation bits, where a bit in each byte may signify continuation or termination. For example, a three-byte integer encoding may look like this:

1xxxxxxx
1xxxxxxx
0xxxxxxx

Notice that the leading bits may form the unary number 2, representing the length 3. This may be referred to as varint-SU in some embodiments, since it is a variable-length representation of integers with length information split across several bytes and represented in unary. In some embodiments, a split unary representation may use the most significant bit as the continuation or termination bit. This may allow embodiments to avoid shift for the terminal byte case. It may also allow for a compiler to use sign checking to test the bit. Some embodiments may, however, utilize the least significant bit of a byte for the continuation or termination bit.

Figure 2A:
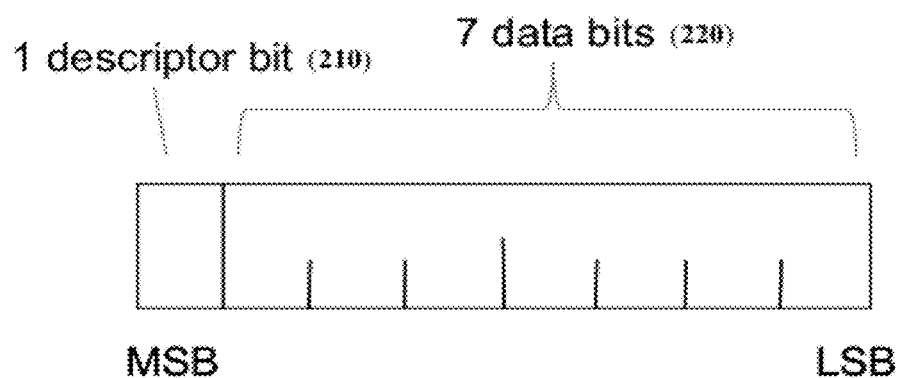
FIG. 2A illustrates a split unary encoding format that can be used in accordance with some embodiments.
Figure 2B:
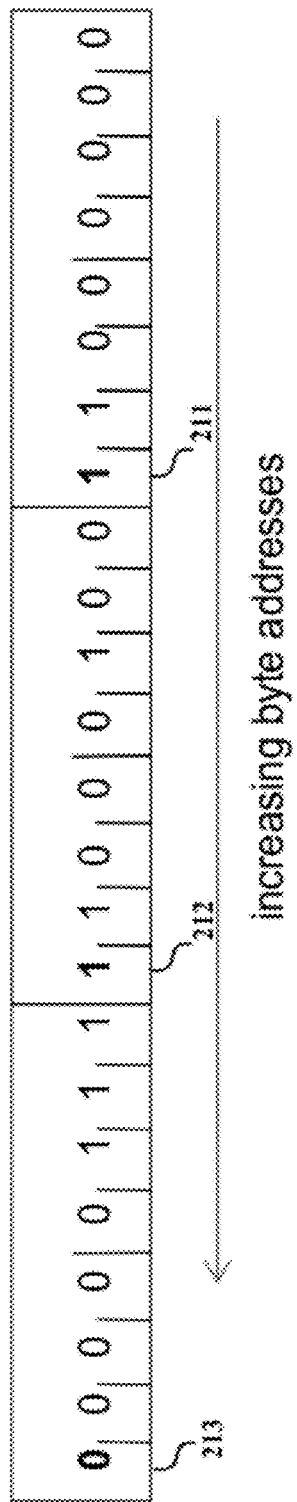
FIG. 2B illustrates an example of data encoded with a split unary encoding format in accordance with some embodiments.

FIG. 2A provides an example of an embodiment of a split unary representation of a byte consisting of 8 bits, with a descriptor bit 210 located in the most significant bit (MSB) and seven data bits 220 located in the remaining bits of the byte. FIG. 2B provides an example where an integer, 123456, may be represented using a split unary representation, where each byte includes a 1 in the MSB, or left most bit in each byte, 211 and 212, for example, if the representation continues to the next byte, and a 0 213 if the end of the integer is reached.

Figure 3A:
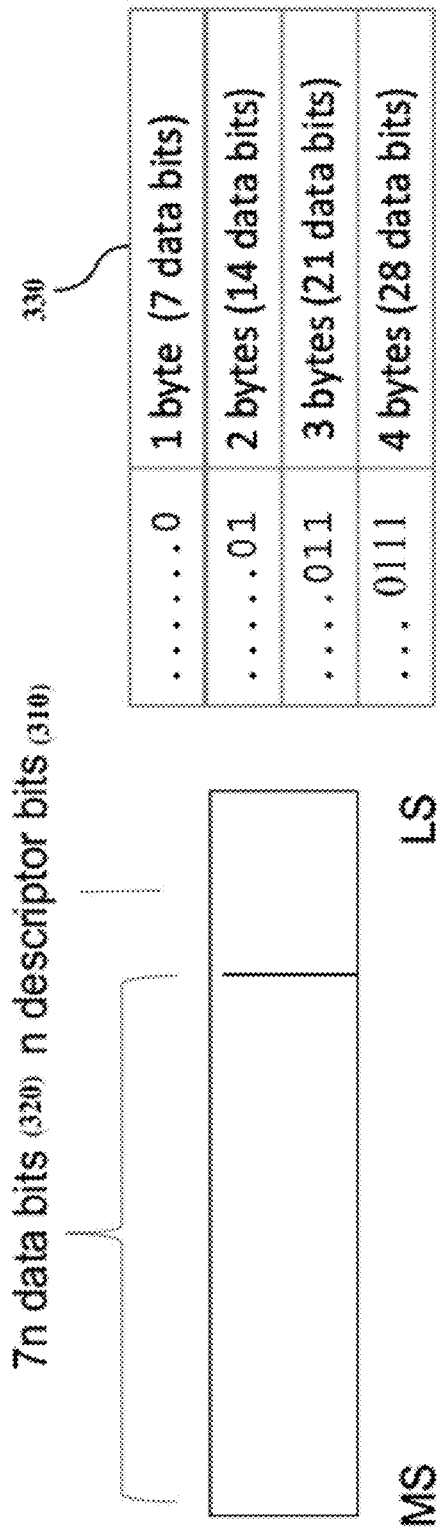
FIG. 3A illustrates a packed unary encoding format that can be used in accordance with some embodiments.
Figure 3B:
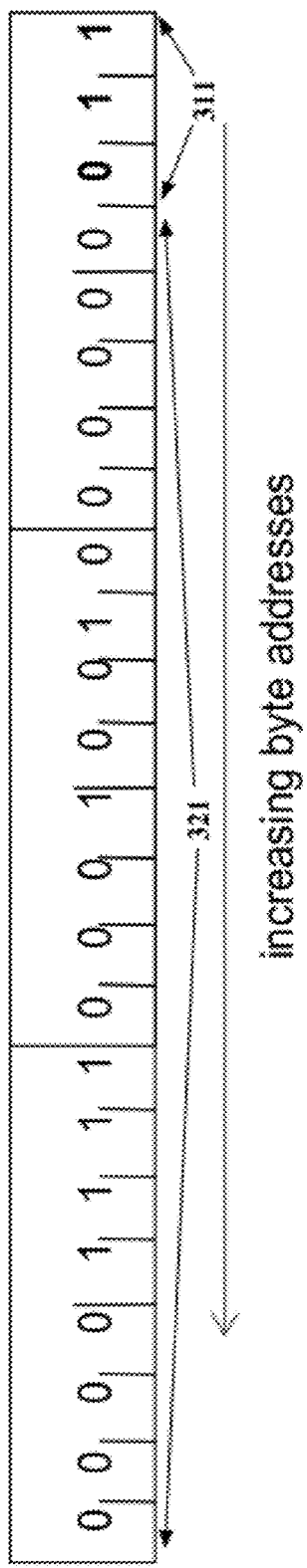
FIG. 3B illustrates an example of data encoded with a packed unary encoding format in accordance with some embodiments.

Some embodiments may include a packed unary representation of a descriptor. This may be referred to as varint-PU in some embodiments, and may be similar to varint-SU, but with the descriptor bits packed together. The packed bits may be collected in the low-order bits of a first byte rather than being split across all bytes. The choice of low-order bits to hold the descriptor may be appropriate for little-endian encodings on little-endian architectures, which is generally known in the art, so that all data bits for one integer are contiguous. For the same reason, on big-endian architectures, placing the descriptor in the high-order bits and using big-endian encoding may be more efficient to decode. FIG. 3A provides one example of an embodiment of a packed unary representation, where n descriptor bits are packed together in the least-significant (LS) bits 310, with 7n data bits in the most significant bits 320. This provides an example of a little-endian architecture. With a big-endian architecture, the descriptor bits may be please in the most significant bits. A table 330 provides four examples of how n descriptor bits may be utilized to represent the number of bytes in the data bits. FIG. 3B shows an example of a packed unary representation of the number 123456, where the first 3 low order bits 011 311 represent the information that the number involves 3 bytes 321.

Embodiments may also include group unary representations that are discussed in more detail below.

Figure 4A:
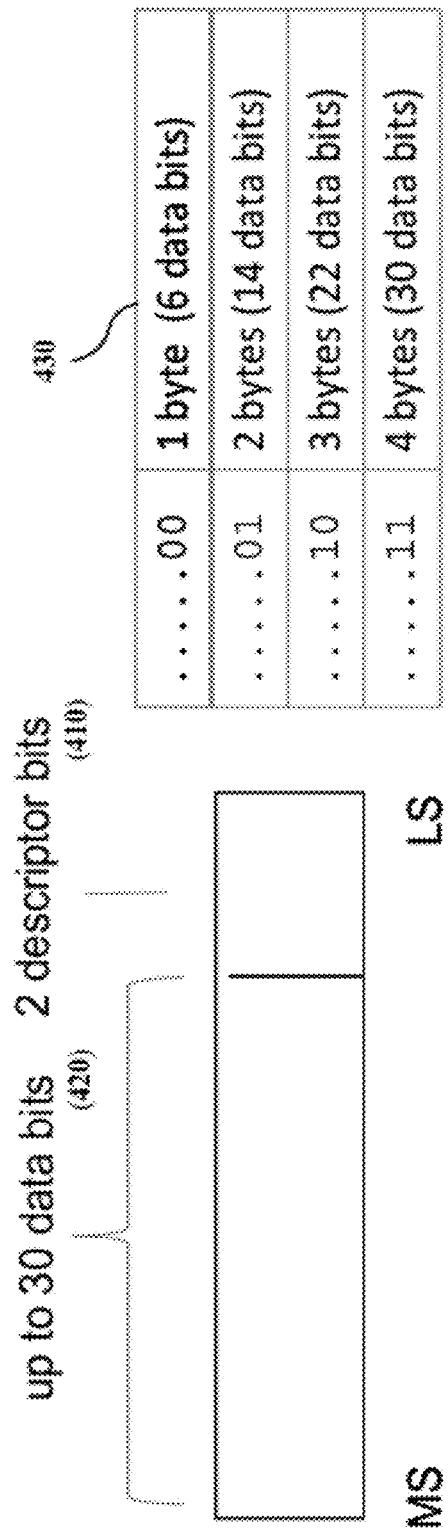
FIG. 4A illustrates a packed binary encoding format that can be used in accordance with some embodiments.
Figure 4B:
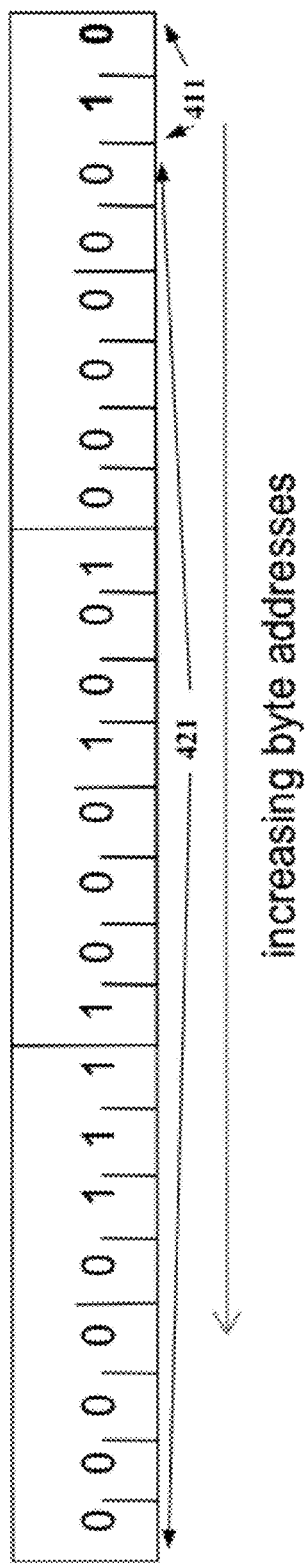
FIG. 4B illustrates an example of data encoded with a packed binary encoded format in accordance with some embodiments.

Some embodiments may utilize a packed binary representation of a descriptor. For example, two bits of a first byte may be reserved to indicate the length of the encoded integer or data in binary. FIG. 4A provides an example for an embodiment where two descriptor bits 410 are utilized, along with up to 30 data bits 420. A table 430 provides four examples of how the two descriptor bits 410 may be utilized to represent the number of data bits. Some embodiments may utilize more or less data bits. FIG. 4B provides one example of how a packed binary representation may be utilized to encode 123456. To represent 123456 involves 17 data bits, which is more than 16 bits (i.e. two bytes) and less than 25 bits (i.e. 3 bytes). The two descriptor bits 411 thus represent that three bytes 421 are provided for the data bits. In this case, the descriptor bits 411 represent the length of 3 bytes as 10.

Other embodiments may utilize other representations. For example, a split binary representation may be utilized in some cases where binary descriptor bits may be split across several bytes for a given integer or data representation. Some embodiments may include group binary representations, which are discussed in more detail below.

Some embodiments may utilize binary length descriptors where the descriptor length may be fixed in advance. While embodiments described herein generally involving binary formats that are shown with fixed length, some embodiments may utilize additional metadata to store the length of a descriptor itself. In addition, some embodiments may include splitting a fixed-length k-bit binary descriptor (one bit per byte), which may result in a byte-oriented integer encoding that may require at least k bytes.

Some encoding formats may group several integers or data together. This may provide opportunities for exploiting SIMD parallelism. Some embodiments may include encodings that satisfy a byte-oriented encoding property that is byte-preserving, where each byte containing significant bits in the original (unencoded) integer or data appears without modification in the encoded form.

Embodiments with group encoding may include separating the descriptor bytes from the data bytes. The separation of descriptor bytes from data bytes in group formats may allow for more efficient decoding in some embodiments. This separation may enable the use of tables to simplify the decoding process. Packed and split representations, however, may also benefit from the use of tables as discussed below in more detail. In some embodiments, group formats may avoid bit-wise manipulation that may otherwise be required to eliminate interspersed descriptor bits. In particular, embodiments with byte-preserving encodings may be especially amenable to decoding with the SIMD techniques, described in more detail below.

Figure 5A:
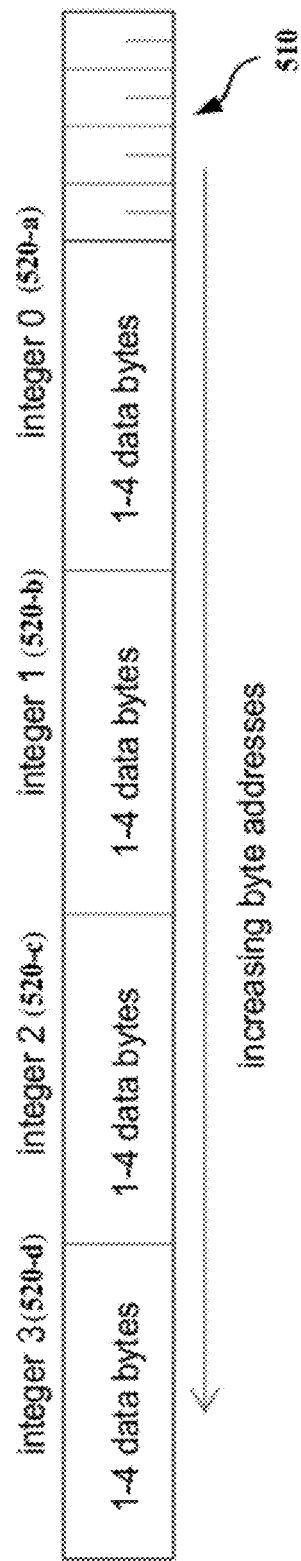
FIG. 5A illustrates a group binary encoding format that can be used in accordance with some embodiments.

FIG. 5A illustrates an example of group binary format byte ordering. In the FIG. 5A example, the byte ordering includes a group of four integers (520-a, 520-b, 520-c, and 520-d) that is preceded by a descriptor byte 510 containing four 2-bit binary numbers. Each 2-bit binary number represents the length of a corresponding integer (e.g. reading right to left, the first 2-bit number represents integer 0 520-a, the next 2-bit number represents integer 1 520-b, and so on). This format shown in FIG. 5A may generally be referred to as varint-GB format.

Figure 5B:
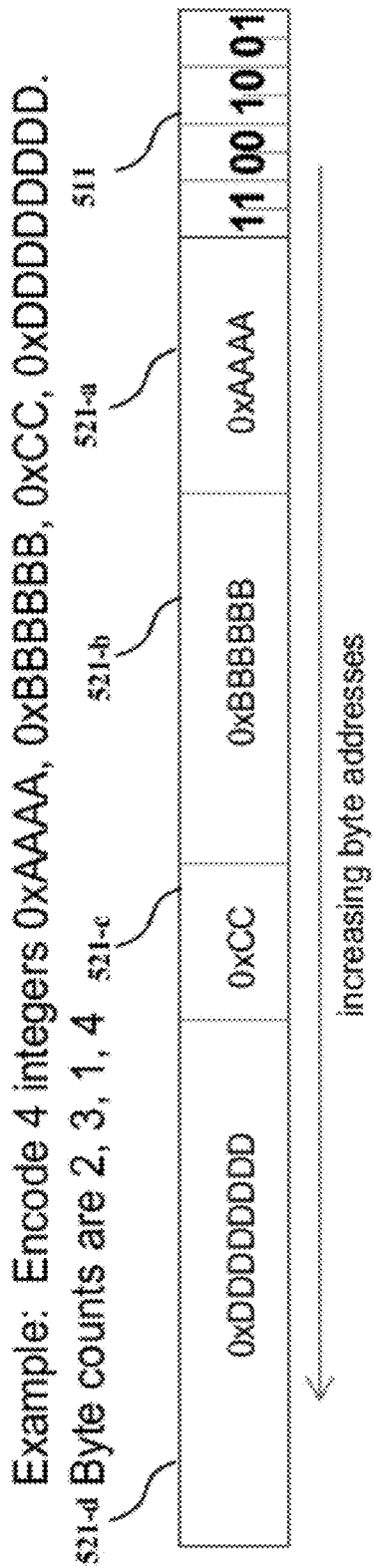
FIG. 5B illustrates an example of data encoded with a group binary encoding format in accordance with some embodiments.

FIG. 5B shows how four hexadecimal numbers 0xAAAA 521-a, 0xBBBBBB 521-b, 0xCC 521-c, 0xDDDDDDDD 521-d may be represented using a group binary format in little-endian byte order. The four integers occupy, correspondingly, 2 bytes, 3 bytes, 1 byte, and 4 bytes. The descriptor byte 511 represents the length n of each byte by a 2-bit binary value n−1. Using this example, the descriptor byte 511 shown in FIG. 5B includes the values 01, 10, 00, and 11 (read from right to left) respectively. 01 represents the 2 byte length of integer 0xAAAA 521-a; 10 represents the 3 byte length of integer 0xBBBBBB 521-b; 00 represents the 1 byte length of integer 0xCC 521-c; 11 represents the 4 byte length of integer 0xDDDDDDDD 521-d. To maintain a consistent order between descriptor bits and data bytes, some embodiments may store the first binary length in the least significant bits. Thus the descriptor byte 511 for the four integers shown in FIG. 5B may be represented as 11001001. Byte addresses increase from right to left, matching the order of increasing bit significance. The order of pairs of bits in the descriptor matches the order of the integers.

Figure 6A:
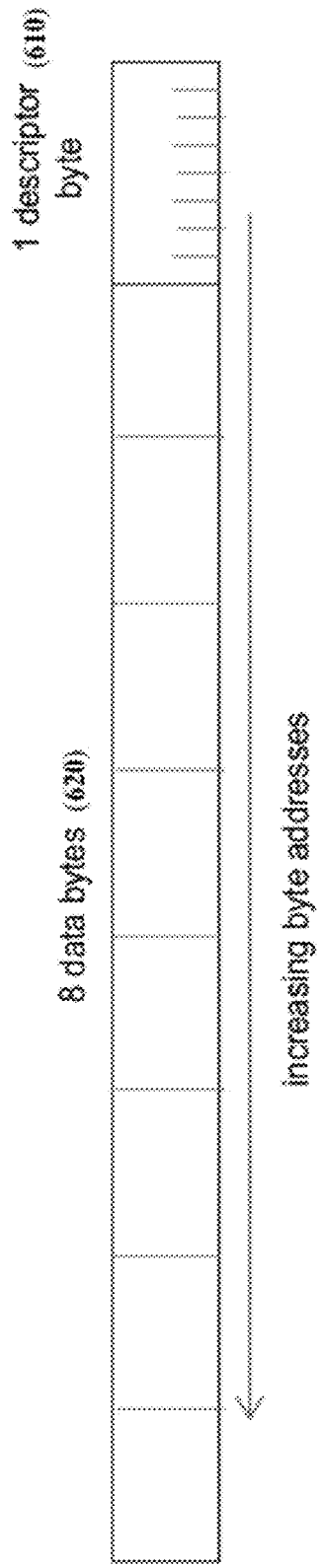
FIG. 6A illustrates a group unary encoding format that can be used in accordance with some embodiments.
Figure 6B:
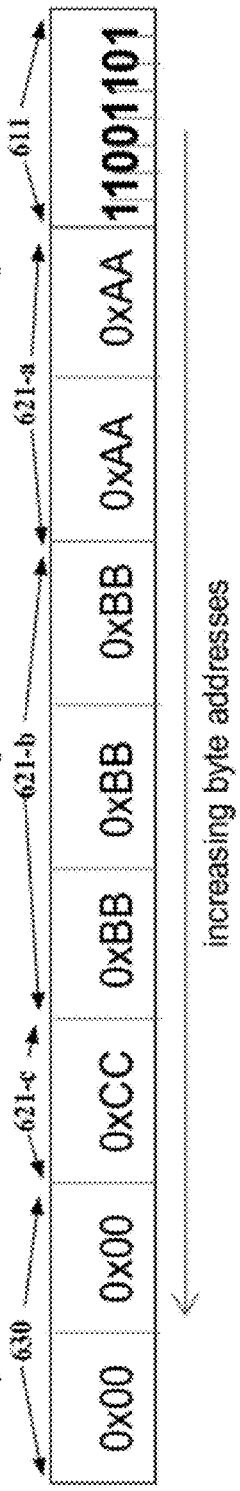
FIG. 6B illustrates example of data encoded with a group unary encoding format in accordance with some embodiments.

Some embodiments of a group binary format involve a fixed number of integers occupying a variable number of bytes, storing their lengths in binary. In contrast, some embodiments of a group unary format involve a fixed number of bytes encoding a variable number of integers, storing their lengths in unary. For example, in one embodiment, referred to as varint-GU, 8 data bytes may be grouped together along with one descriptor byte containing the unary representations of the lengths of each encoded integer. Each of the 8 data bytes may encode as few as two integers and as many as eight integers, depending on their size. The number of zeros in the descriptor indicates the number of integers encoded in the group. An embodiment of a group unary format is shown in FIG. 6A. In this embodiment, a block size of 8 620 may be the minimal size that can use every bit of the descriptor byte 610; larger multiples of 8 are possible for some embodiments. FIG. 6B provides an example of encoding four integers using a group unary format. In this example, the same four integers 0xAAAA, 0xBBBBBB, 0xCC, and 0xDDDDDDDD as shown with the group binary format in FIG. 5B are used to illustrate a group unary format. Encoding these values would involve 10 bytes, but only 8 bytes are available in the block. The first three integers 0xAAAA 621-*a*, 0xBBBBBB 621-*b*, and 0xCC 621-*c* fit into the block using 6 bytes, leaving 2 bytes of padding 630. The final integer 0xDDDDDDDD is left for the next block (not shown). The descriptor 611 contains the three unary values 01 (representing the 2-byte length of 0xAAAA 621-*a*, 011 representing the 3-byte length of 0xBBBBBB 621-*b*, and 0 representing the 1-byte length of 0xCC 621-*c*, along with two padding bits 11 representing the 2 bytes of padding 630. These are arranged in the same order as the integers, giving the descriptor a binary value of 11001101.

Figure 6C:
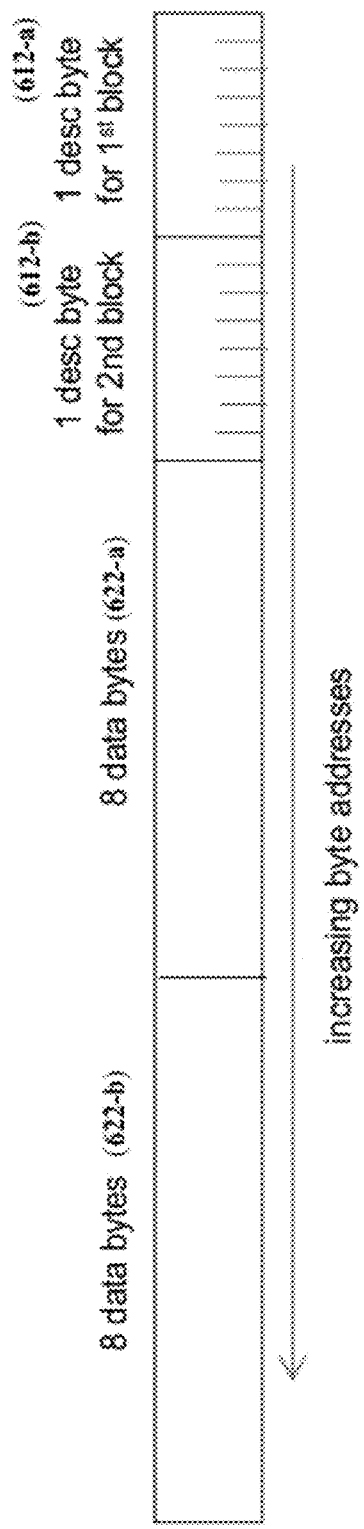
FIG. 6C illustrates a group unary encoding format that can be used in accordance with some embodiments.

FIG. 6C provides an example of a group unary format that may encode up to 16 data bytes. In embodiment, two descriptor bytes (612-*a* and 612-*b* respectively) are utilized, where the first descriptor byte 612-*a* describes a first block of up to 8 data bytes 622-*a* and a second descriptor byte 612-*b* describes a second block of up to 8 data bytes 622-*b*. Other embodiments of a group unary format may encode even more data bytes, such as for 24 or 32 data bytes, merely by way of example, where an addition descriptor byte may be provided for each additional group of 8 data bytes. While this examples shows descriptor bytes that are contiguous with the data bytes, some embodiments may include descriptor bytes that are not contiguous with the data bytes.

Since not every group of encoded bytes, which may represent integers in some embodiments, may fit evenly into an 8-byte block, some embodiments may provide variations of the encoding. These may be referred to as incomplete or complete in some cases.

In an incomplete block variation, which may be referred to as varint-G8IU in some embodiments, embodiments may store as many integers as fit in 8 bytes, leaving the data block incomplete if necessary. In the embodiments discussed, 8 refers to the number of bytes in a data block. An embodiment of an incomplete block variation was discussed above with respect to FIG. 6B. The remaining space may be padded with zeros, but may be ignored on decoding. When there is no additional integer to decode, the final (most significant) bits of the descriptor may be an unterminated sequence of 1 bits. Some embodiments may include a variation of this encoding format that uses variable size data blocks and avoids padding.

Figure 7A:
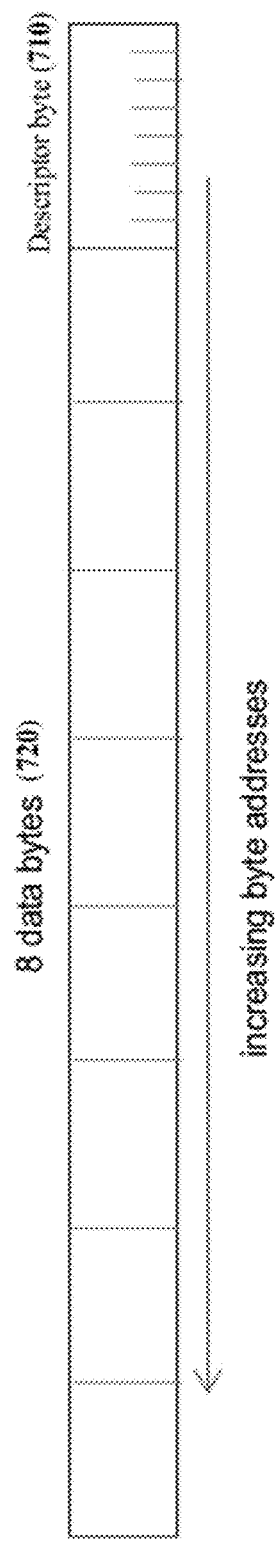
FIG. 7A illustrates a group unary encoding format that can be used in accordance with some embodiments.
Figure 7B:
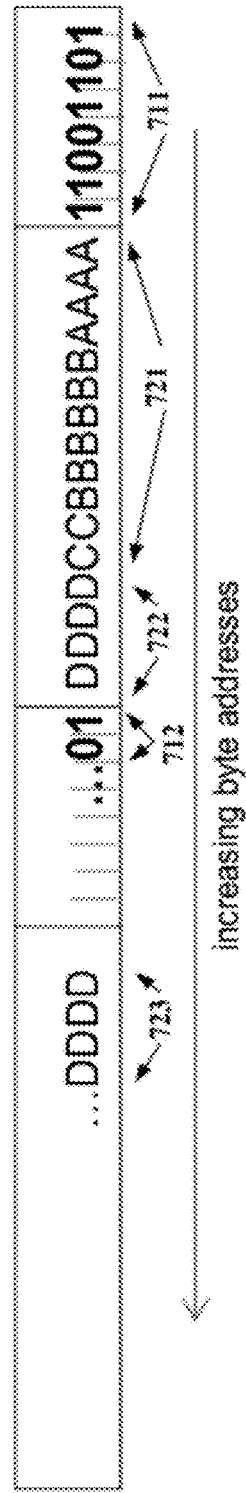
FIG. 7B illustrates an example of data encoded with a group unary encoding format in accordance with some embodiments.

In embodiments that utilize a complete block variation, which may be referred to as varint-G8CU in one embodiment, all the bytes in a data block may be filled. For example, in an varint-G8CU embodiment, all eight bytes in a data block are filed. As before, the number of zero bits in the descriptor indicates the number of complete integers encoded. In situations where an integer exceeds the remaining space in the current block, as much of that integer as fits is placed in the current block. The remaining bytes of that integer are carried over into the next data block. Similarly, the corresponding descriptor bits are carried over to the next block's descriptor byte. FIG. 7A provides an example of a group unary format with complete block, with 8 data bytes r 720 and a descriptor byte 710; it is similar to FIG. 6A. FIG. 7B shows how bytes may be carried over to the next data block. Again, merely for example purposes, FIG. 7B shows the same four integers 0xAAAA, 0xBBBBBB, 0xCC and 0xDDDDDDDD as used in several other examples. The first three integers 721 and the corresponding descriptor bits 711 are stored exactly as in varint-G8IU. However, varint-G8CU may handle the fourth integer differently. Its first two bytes 722 are placed in the first data block, filling it entirely, and the remaining two bytes 723 go into the following block. The two descriptor bits corresponding to these last two bytes 712 go into the next block's descriptor byte. Although spread across two descriptor bytes, the unary value of the descriptor bits for this fourth integer still represents the length −1 of the encoded integer.

Figure 7C:
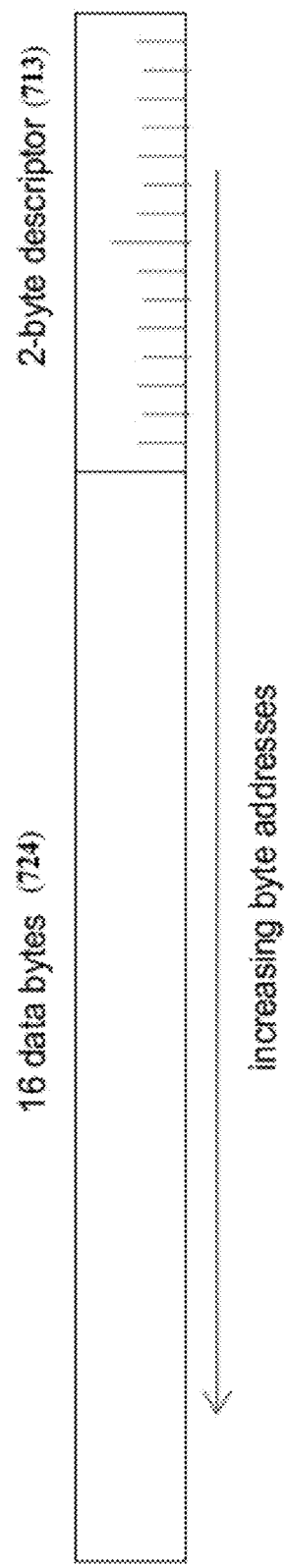
FIG. 7C illustrates a group unary encoding format that can be used in accordance with some embodiments.

FIG. 7C provides an example of a group unary format that may utilize two descriptor bytes 713 followed by 16 data bytes 724. This embodiment may be implemented, for example, with a 128 bit register.

Figure 8:
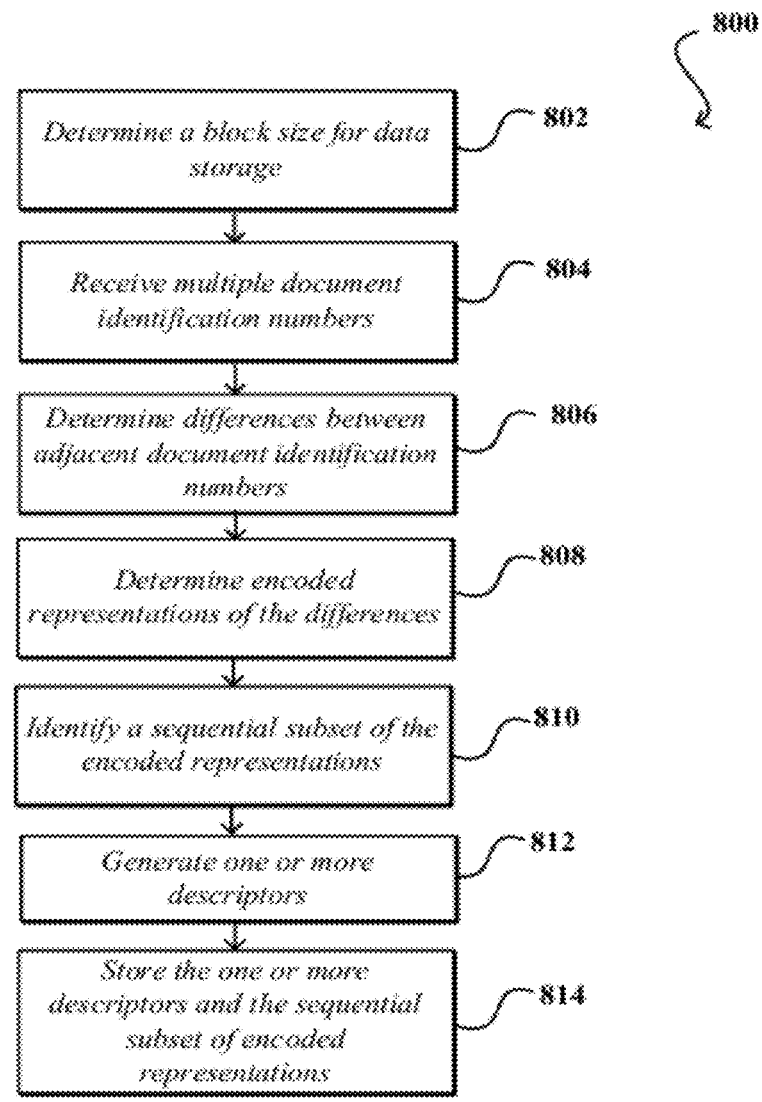
FIG. 8 illustrates a method for encoding document identification numbers for a search engine posting list that can be used in accordance with some embodiments.

FIG. 8 provides a computer-implemented method 800 for encoding document identification numbers for a search engine posting list in accordance with various embodiments. Method 800 may be implemented in environments and devices as seen in environment 100 of FIG. 1, for example. Method 800 may also include and/or utilize aspects of the group formats discussed with respect to FIGS. 6A-C and/or 7A-C. Under control of one or more computer systems configured with executable instructions, method 800 includes determining a block size for data storage 802. Multiple document identification numbers for the search engine posting list are received 804. Differences between adjacent document identification numbers are determined 806. An encoded representation of each document identification number difference is determined 808. The encoded representations of the document identification number differences use variable-length representations. A sequential of the multiple encoded representations of the document identification number differences is identified 810. A sum of respective sizes of the encoded representation of each document identification number difference of the sequential is less than or equal to the determined block size for data storage. One or more descriptors are generated 812. The descriptors provide information regarding the number of encoded representations of document identification number differences in the sequential of encoded representations of document identification number differences and the size of each respective encoded representation of a respective document identification number difference. The descriptors may represent the size of each respective encoded representation of a document identification number difference with a unary representation of each respective size. The one or more descriptors and the sequential of encoded representations of the document identifications differences are stored 814. The sequential of encoded representations of the document identification number differences is stored as a group and the one or more descriptors are stored contiguous with the group of encoded representations of document identification number differences.

Figure 9:
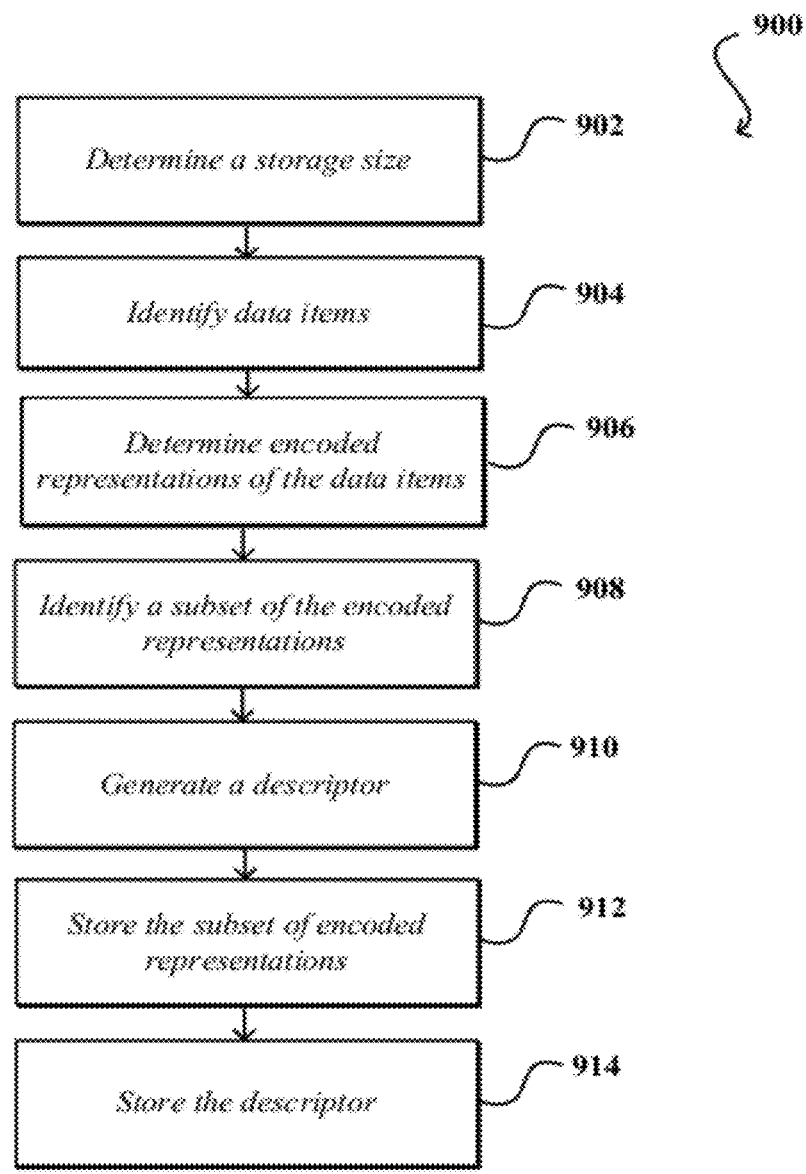
FIG. 9 illustrates a method for encoding variable-length data that can be used in accordance with some embodiments.

FIG. 9 provides a computer-implemented method 900 for encoding data using variable-length representations in accordance with various embodiments. Method 900 may be implemented in environments and devices as seen in environment 100 of FIG. 1, for example. Method 800 may also include and/or utilize aspects of the group formats discussed with respect to FIGS. 6A-C, 7A-C, and/or method 800 of FIG. 8. Under control of one or more computer systems configured with executable instructions, method 900 includes determining a block size for data storage 902. Multiple data items are identified 904. In some cases, the data items are delta-gaps. An encoded representation of each data item is determined 906. The encoded representations of the data items use variable-length representations. A first subset of the multiple encoded representations of the data items are identified 908. A sum of respective sizes of the encoded representations of the data items from the first subset of the multiple encoded representations of data items is less than or equal to the determined block size for data storage. A first descriptor is generated 910. The first descriptor represents the respective sizes of the encoded representations of the data items of the first subset. The first subset of the multiple encoded representations of the data items is stored as a first stored group 912. The first descriptor is also stored 914.

In some embodiments, the first descriptor is stored contiguous with the first stored group, while in other cases the descriptor may be stored non-contiguous with the first stored group. The descriptor may represent the size of each respective encoded representation for each data item in a unary format. A unary format may include describing the respective size of each encoded representation for each data item as the unary size minus one, while separating the representation of each respective length by a zero. In some cases, padding information may be inserted into the first descriptor representing a difference in size between the first subset and the determined block size of data. This may be the case when the size of the multiple encoded representations for the data items is less than the determined block size for data storage.

In some embodiments, an additional encoded representation of a respective data item from the multiple encoded representations of the data items may be identified. At least a first portion of the additional encoded representation of the respective data item may be stored as part of the first stored grouped. At least a second portion of the additional encoded representation of the respective data item may be stored as part of a second stored group. A second descriptor may be generated in these cases. The second descriptor may represent in part the size of at least the second portion of the additional encoded representation of the respective data item as part of the second stored group.

Embodiments may include several different decoding methods that may be utilized to decode one or more of the encoding formats discussed above. These decoding methods may also be useful for other encoding formats that may not necessarily be discussed in this disclosure. Some embodiments may utilize single instruction multiple data (SIMD) instructions. Embodiments may utilize such instructions to act in parallel on multiple bytes found with the different encoded formats.

Some embodiments may utilize SIMD instructions available for different platforms, including, but not limited to Intel® 64 architecture implemented in processors by Intel and AMD and in extensive use in many data centers. In the Intel® 64 architecture, a series of SIMD enhancements have been added over time. Among the SIMD capabilities are 16-byte XMM vector registers and parallel instructions for operating on them. Some embodiments may utilize SIMD instructions for other formats to provide similar or different capabilities to the Intel® 64 architecture.

Some embodiments may utilize a shuffle instruction. Merely by way of example, the PSHUFB instruction, introduced with SSSE3 in 2006, may be utilized in some embodiments. It performs a permutation ("shuffle") of bytes in an XMM register, allowing the insertion of zeros in specified positions. PSHUFB has two operands, a location containing the data and a register containing a shuffle sequence. If the original value of the data operand is preserved, PSHUFB can be viewed as transforming a source sequence (src) of bytes to a destination sequence (dst) according to the shuffle sequence (shf). The following provides one example of pseudocode that may provide a shuffle sequence as seen with PSHUFB.

```
for 0 ≤ i < 16 do in parallel
    if shuffle[i] ≥ 0 then
        dst[i] ← src[shuffle[i] mod 16]
    else
        dst[i] ← 0
end
```

Merely by way of example, the ith value in a shuffle sequence indicates which source byte to place in the ith destination byte. In some embodiments, if the ith value in the shuffle sequence is negative, a zero is placed in the corresponding destination byte.

Some embodiments may utilize other SIMD shuffle instructions besides the PSHUFB instruction. For example, VPERM from the AltiVec/VMX instruction set for the PowerPC processor may provide similar functionality for the purposes of the decoding methods discuss below. In addition, other shuffle instructions for other platforms may provide functions and may be utilized in different embodiments.

Figure 10:
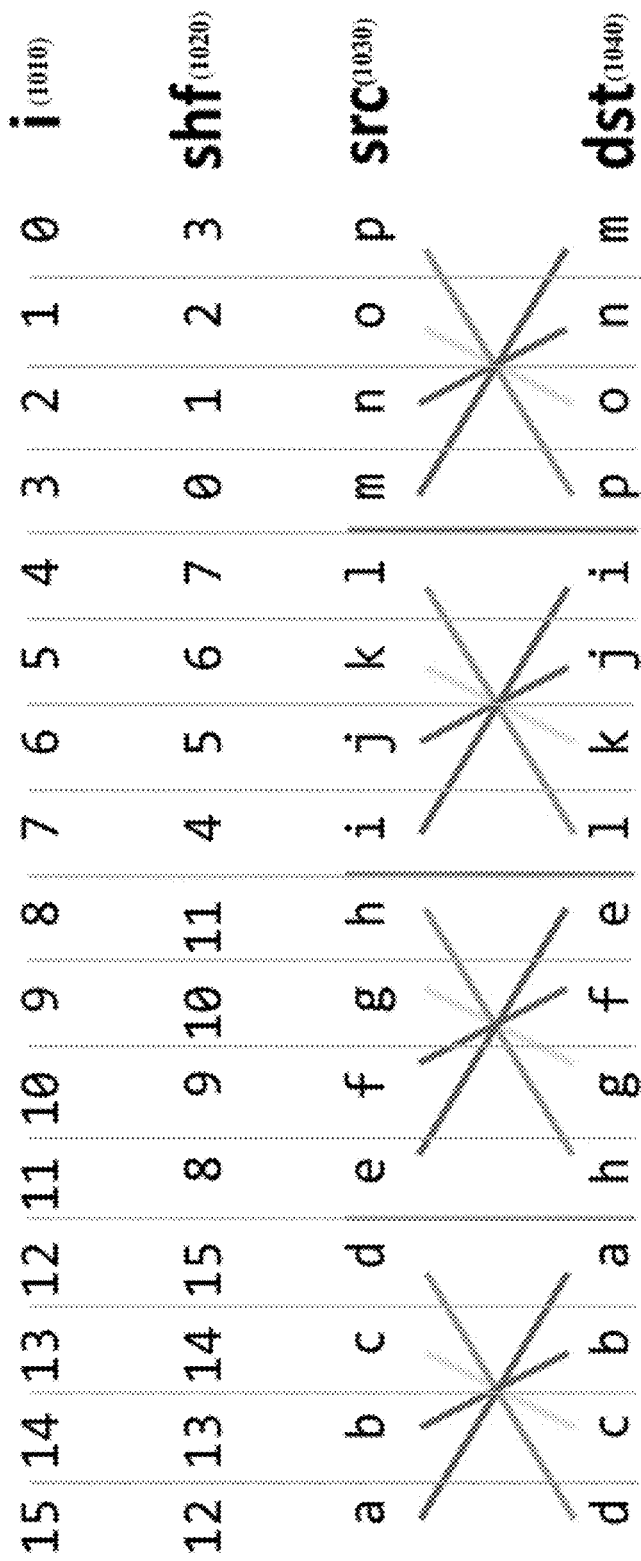
FIG. 10 illustrates a parallel shuffle operation that can be used in accordance with some embodiments.

The example illustrated in FIG. 10 shows how PSHUFB can be used to reverse the byte order of four 32-bit integers at once with index sequence i 1010, shuffle sequence shf 1020, source sequence src 1030, and destination sequence dst 1040.

Some embodiment as discussed above may include byte-preserving formats that remove leading zero bytes while retaining the significant bytes intact for one or more integers or data of interest. Decoding may then include reinserting the zero bytes in the right places. Some embodiments may utilize a shuffle sequence that may be constructed by inserting –1s in a sequence {0, 1, 2, 3, . . . }. Some embodiments may utilize something besides a –1 to insert in the sequence of integers. With this sequence, a shuffle instruction, such as PSHUFB, may copy the significant data bytes while inserting the missing zeros.

An example of using a shuffle instruction, such as PSHUFB, to decode one of the encoded formats discussed above in shown in FIG. 11. In this example, the encoded format is a group unary format referred to as varint-G8IU. This is same data represented in FIG. 6B. FIG. 11 shows a shuffle sequence shf 1120, an index sequence i 1110, a source sequence src 1130 of the encoded format, and destination sequence dst 1140 for the decoded data. For example, the right most byte (i.e. the byte with the lowest address) of the shuffle sequence, 0, at index 0, takes the $0^{th}$ source byte and puts it in the $0^{th}$ destination byte. In general, the ith shuffle sequence entry instructs which entry location the source to pick from and then place in the ith destination location. As another example, FIG. 11 shows that for i=4, the shuffle sequence says that the source at index 2 is to be placed at destination with index 4. In addition, when the shuffle sequence has a –1 (which may be represented in different ways in other embodiments) zero values s are place in the destination at that index. As an example, at index i=3, the shuffle sequence has a –1, in which case, zeros will be place at the destination at index i=3. In this particular example, 3 integers are decoded, resulting in an output offset of 3 as noted in the figure.

For a given format, a correct shuffle sequence may be precomputed for a particular data block and its corresponding descriptor byte. For possible values of the descriptor (and sometimes additional state), a table of any shuffle sequence may be built that might be needed at decode time.

In some embodiments, the table entries also contain a precomputed offset. For a group binary format, such varint-GB format, the offset may indicate how many bytes were consumed to decode 4 integers; it may output 16 bytes for example. Other embodiments may output more or less bytes and made involve more or less integers in some cases. For the group unary formats, such as varint-GU formats, the offset may indicate how many integers were decoded; it may consume 8 bytes for example. Other embodiments may consume more bytes if utilized.

Table construction may occur only once in some embodiments, while table lookup may occur every time a group is decoded.

Given the availability of these tables, a general method of decoding may be described as follows:
1. read a chunk of data and its corresponding descriptor;
2. look up the appropriate shuffle sequence and/or offset from the table;
3. perform the shuffle;
4. write the result;
5. advance the input and output pointers.

Figure 12:
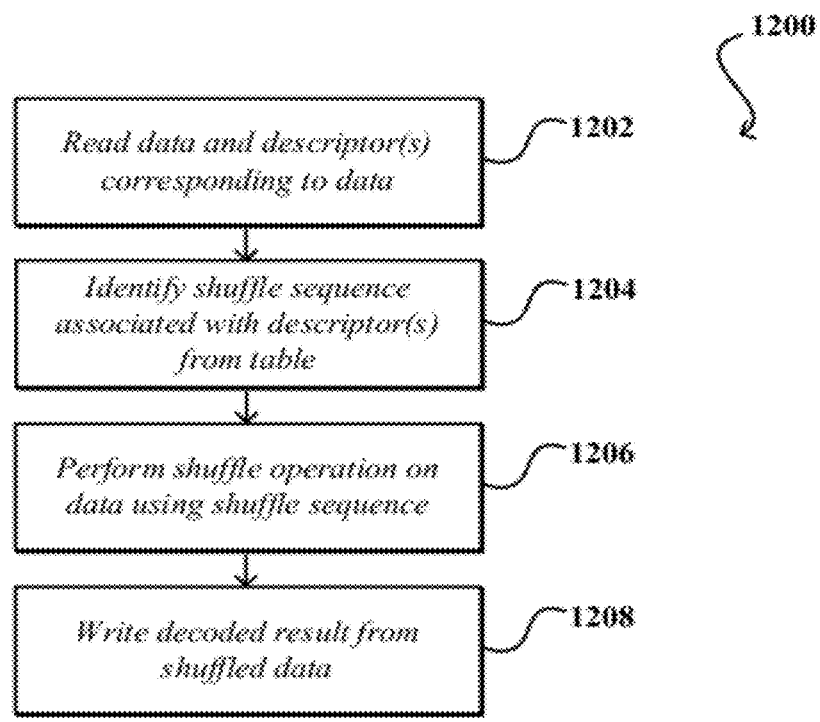
FIG. 12 illustrates a method of decoding that can be used in accordance with some embodiments.

FIG. 12 provides a block diagram for some methods of decoding in accordance with some embodiments. At block 1202, data and one or more descriptors corresponding to the data are read. At block 1204, one or more shuffle sequences associated with the descriptor(s) are identified from a table that may be precomputed. At block 1206, a shuffle operation is performed on the data using the shuffle sequence. This operation may occur in parallel. At block 1208, a decoded result is written from the shuffled data. In some embodiments, information about how much data has been read will returned.

The following provides different implementations of the above steps for several different formats, though other embodiments may utilize more or less of these steps for other formats.

Embodiments allow for several integers or data to be decoded simultaneously with very few instructions. Some embodiments may not require conditionals, and thus avoid performance penalties due to branch misprediction. Logical complexity may be shifted from the code to the table. Embodiments may include reads and writes of a fixed amount and then rely on the table to determine how much input data or output data it has actually processed. This may require that the input and output buffers have at least this amount available to read or write.

In some embodiments, data blocks are not aligned on any fixed boundary. Some embodiments may depend on the ability of a CPU to perform unaligned reads and writes efficiently.

Some embodiments may utilize parallel decoding, which may be described in some cases using pseudocode such as the following:

---

Decodes a chunk of data using parallel (SIMD) shuffle.

```
   input  : src, dst, state
   output: src, dst, state
1  begin
2      desc ← read(src, 1)
3      data ← read(src + 1, 16)
4      entry ← table_format[desc, state]
5      shuffleAndWrite(data, entry.shuffleSequence, dst)
6      src ← src + entry.inputOffset
7      dst ← dst + entry.outputOffset
8      state ← entry.state
9      return src, dst, state
10 end
```

---

Because this method constitutes an inner loop of a decoding process, embodiments may inline the implementation to avoid function call overhead. Embodiments, as shown above in the pseudocode, may take three inputs:
  src—a pointer to the input byte stream of encoded values;
  dst—a pointer to the output stream of integers in case of varint-GB, and varint-G8IU; in the case of varint-G8CU, dst may be a pointer to an output stream of bytes, since decoding a block of varint-G8CU may result in writing a portion of a decoded integer; and
  state—auxiliary state, which may be used for varint-G8CU to indicate the number of bytes modulo 4 of the last integer written.

Embodiments may read encoded values from the input stream, output decoded integers or data to the output stream and return as its result the new positions of src, dst, and the updated state.

Some embodiments may read 16 bytes, which is the size of some registers, such as the XMM register used by the PSHUFB operation. However, more bytes may be read; for example, some registers may have a smaller or larger size, such as for 8 bytes or 32 bytes, merely by way of example. The number of bytes corresponding to a single byte descriptor may be 8 for the unary formats and may be at most 16 for the binary format.

Embodiments may utilize different tables for each format. For example the table may have 256 entries for the varint-GB and varint-G8IU formats, one for each descriptor value. For varint-G8CU format, the table may have 4×256=1024 entries, because there may be an entry for each descriptor and state pair, and the state is an integer i, with 0≤i<4.

Some embodiments may utilize an operation such as the shuffleAndWrite operation that uses the PSHUFB operation with the provided shuffle sequence to expand the 16 bytes of data inserting zeros into the correct positions, and then writes its result to the destination. Other embodiments may similarly utilize use a shuffle sequence along with a parallel shuffle operation to expand a series of bytes of data with the insertion of zeros into correction positions and writing the result.

In the varint-GB case, the shuffle sequence may be a 16-byte sequence describing a single PSHUFB operation. A single PSHUFB may be sufficient because the group contains four encoded integers, and thus the output may not exceed 16 bytes.

For decoding the group unary formats in some embodiments, the shuffle sequence may be a 32-byte sequence specifying two PSHUFB operations. The second PSHUFB may be required for the unary formats because an 8-byte data block may encode up to 8 integers, which can expand to 32 bytes. The output of the first PSHUFB may be written to locations beginning at dst, and the output of the second PSHUFB to locations beginning at dst+16. To avoid conditionals, the second shuffle may be performed, even when the output does not exceed 16 bytes. Since PSHUFB rearranges the register in place, the corresponding register may be reloaded with the original data before the second PSHUFB. Some embodiments may only involve a single shuffle operation. Some embodiments may utilize one shuffle rather than two shuffles.

For some unary formats, the input offset, by which may increment the src in the above pseudocode, may be 8 bytes. For varint-G8IU, the output offset measured in units of decoded integers may vary between 2 and 8, except for the last block of a sequence, which might contain between 1 and 8 integers. For varint-G8CU, decoding one block may result in writing a portion of a decoded integer, so the output is a byte stream and the offset is measured in byte units. The output is between 8 and 32 bytes, except for the last block of the sequence which may output between 1 and 32 bytes.

In the case of the binary format, the output offset may be a constant 4 integers. Embodiments of the varint-GB format may have auxiliary information to deal with sequences of length not divisible by 4. This may be done using length information stored separately or the convention that zero values may not appear in the sequence, so terminal zeros may be ignored. The input offset may vary between 4 and 16 bytes. For these encoding embodiments, the input offset may account for the additional one byte of the descriptor as well. Variable offsets may be precomputed and stored in the format table.

For the varint-G8CU format, the table also may contain the new state information indicating the number of bytes in the last integer to be used to decode the subsequent block.

For each of the encoded formats, a decoding table may be constructed in advance. Such decoding tables may be utilized in methods for decoding, such as that described above. Each table may include a table entry corresponding to each possible descriptor value and state value. Each table entry logically contains four things:
- a shuffle sequence
- an input offset
- an output offset
- the state value to use for the subsequent block For some of the formats, some of these values are constant over all entries in the table, and so do not need to be stored explicitly.

The table construction process can take as input a descriptor byte value and a state value. It can build the shuffle sequence for the entry and compute the input and output offsets and next state.

Some embodiments may deal with valid descriptor values, those which could actually arise from encoding. For varint-GB, all possible byte values may be valid. For the group unary formats, a descriptor may be valid if the distance between consecutive zero bits does not exceed 4.

The methods for constructing shuffle sequences, offset values, and the next state value may depend on the following abstract functions in some embodiments:

num(d) gives the number of integers whose encoding is completed in the group described by the descriptor value d. For varint-GB, this is 4 (except for the last block where it may be 1 to 4). For the group unary formats, this value may be the number of 0 (termination) bits in d.

len(d; i) gives the length of the ith integer in the group, for each i, 0≤i<n. This may be the length determined by the ith individual bit pair in d for varint-GB, or the ith unary value in d for the unary formats.

rem(d) gives the number of bytes modulo 4 in the last encoded integer in the group. This may be needed for varint-G8CU, where it is equal to the number of leading 1s in the descriptor. For the other formats, it may be 0.

Embodiments may construct a shuffle sequence that may be utilized to insert −1s (or other possible numbers to present blocks of zeros) in a sequence {0, 1, 2, 3, ...} representing the byte positions in one block of the source data being decoded. The resulting shuffle sequence may be utilized by a shuffle instruction, such as the PSHUFB instruction, to copy the significant data bytes while inserting the missing leading zeros. The following pseudocode provides one description of the construction of a shuffle sequence for a given descriptor value that may be utilized for different embodiments:

---

Construct a shuffle sequence for a given descriptor value input : desc descriptor byte value
       : state the number of bytes of the incomplete integer in the previous block
output: shuffle the shuffle sequence for the given descriptor and state value
begin
  j, k ← 0
  s ← 4 - state
  for 0 ≤ i < num(desc) do
    for 0 ≤ n < s do
      if n < len(desc, i) then
        shuffle[k] ← j
        j ← j + 1
      else
        shuffle[k] ← −1
      end
      k ← k + 1
    end
    s ← 4
  end
  for 0 ≤ n < rem(desc) do
    shuffle[k] ← j
    j ← j + 1
    k ← k + 1
  end
  return shuffle
end

---

The above shuffle sequence construction pseudocode includes two inputs:

desc: the descriptor value state: the number of bytes modulo 4 written from the last integer in the prior group. For varint-GB and varint-G8IU, the value of state is always 0, since only complete integers are written in a given data block in these formats.

The first loop iterates over every completed integer in the group corresponding to the given descriptor. For each completed integer in the group, the inner loop sets the shuffle sequence to move the encoded bytes from the source of the shuffle operation, inserting −1s to produce the leading zeros necessary to complete the decoded integer. Here the variable j advances over the source data positions in the data block, while the variable k advances over the positions in the shuffle sequence, which correspond to destination positions of the shuffle operation.

The concluding loop may be needed for varint-G8CU. It sets the remainder of the shuffle sequence to transfer encoded bytes from the source for the last incomplete integer in the group. The loop has no effect for the other group formats, where rem(desc) is zero.

Embodiments may also compute input offsets. For the unary formats, the input offset may equal the number of block data bytes along with the number of descriptor bytes. For example, the offset would be 9 in the case where there is a block of 8 bytes of data and 1 descriptor byte. For the group binary format, such as varint-GB, the input offset for a given descriptor d may be described as:

$$1 + \sum_{i=0}^{3} len(d, i)$$

which is the sum of the lengths of the integers in the group plus 1 for the descriptor byte.

The output offset for varint-GB and varint-G8IU may equal to num(d) integers, where i may be 4 for varint-GB. The output offset for varint-G8CU may be represented as:

$$4 \cdot num(d) - state + rem(d).$$

The state value for the subsequent block may be 0 for varint-GB and varint-G8IU and rem(d) for varint-G8CU.

Some embodiments may utilize specific implementations of the methods described above. For example, the following description provides several specific methods for decoding some of the specific formats discussed above.

In some embodiments, to decode a group of integers (which may be 4 in some embodiments) in varint-GB, the length and shuffle sequence entries may be looked up in a table indicated by the descriptor, the shuffle sequence may be applied to the input data, and the input may be advanced by the length found in the table. The output may advance by the length of 4 integers (i.e. 16 bytes). This may be shown in following pseudocode. This method may be applicable and adaptable to other group binary formats and some of the other formats, such as a split unary format.

---

Decodes 4 integers stored in varint-GB format using parallel shuffle.

```
input  : source-position, destination-position
output: writes to destination, returns new source position
begin
    descriptor ← first byte of source data
    vector register ← next 16 bytes of source data
    shuffle-sequence ← table[descriptor].shuffle
    shuffle vector register using shuffle-sequence
    write result from vector register to destination position
    return source-position + table[descriptor].offset
end
```

---

A table of lengths and shuffle sequences that may be utilized with the above decoding may be constructed in different ways. In some embodiments, the table has an entry for each possible value of the descriptor byte. Iterating over all possible values of the descriptor byte, the table entry may be constructed for a given descriptor byte value. The length stored in the table may be the sum of the lengths described by each pair of bits in the descriptor byte, plus one to advance past the descriptor byte itself. The shuffle sequence may be built so as to map bytes from the source to the destination, but may be padded with –1s in order to fill each decoded integer with leading zeros up to four bytes. The following may describe one way of constructing such a table. This method of table construction may be applicable and adaptable to other group binary formats and some of the other formats, such as a split unary format.

---

Construct a single shuffle and length table entry for the varint-GB decoder.

```
input  : descriptor byte value
output: shuffle-sequence, length
begin
    length ← 1
    source-pos ← 0
    shuffle-pos ← 0
    for i from 0 to 3 do
        length-i ← value of ith pair from descriptor byte + 1
        length ← length + length-i
        for j from 0 to 3 do
            if j < length-i then
                shuffle-sequence[shuffle-pos] ← source-pos
                source-pos ← source-pos + 1
            else
                shuffle-sequence[shuffle-pos] ← –1
            end
            shuffle-pos ← shuffle-pos + 1
        end
    end
end
```

---

Decoding varint-G8IU may be somewhat more complicated than decoding varint-GB. Because as many as 8 integers may be encoded in a single block, their decoded form may occupy as many as 32 bytes. Since some architectures, such as the Intel® 64 XMM vector registers, may only have 16 bytes, two shuffles may be performed to produce the full 32 bytes of output. Some embodiments may be able to decode with only one shuffle operation. Rather than checking to see whether the second shuffle is necessary, some embodiments may simply perform both shuffles every time and determine how much of the output data to keep. The following pseudocode provides one description one such method of decoding 8 bytes in a varint-G8IU format:

---

Decodes 8 bytes stored in varint-G8IU format using two shuffles.

```
input  : source-position, destination-position
output: writes to destination, returns new destination-position
begin
    descriptor ← first byte of source data
    vector register ← next 16 bytes of source data
    shuffle-sequence-1 ← table[descriptor].shuffle1
    shuffle-sequence-2 ← table[descriptor].shuffle2
    length ← table[descriptor].length
    shuffle vector register using shuffle-sequence-1
    write result from vector register to destination-position
    shuffle vector register using shuffle-sequence-2
    write result from vector register to destination-position + 16
    return destination-position + length
end
```

---

After decoding one block of varint-G8IU, the input may be advanced by 8 bytes, but the output position may advance a variable amount depending on the number of integers decoded. In some embodiments, the vector register may be filled with 16 bytes of input data, even though only 8-byte block may be decoded. This method may be applicable and adaptable to other group unary formats and some of the other formats, such as a split unary format.

Figure 13:
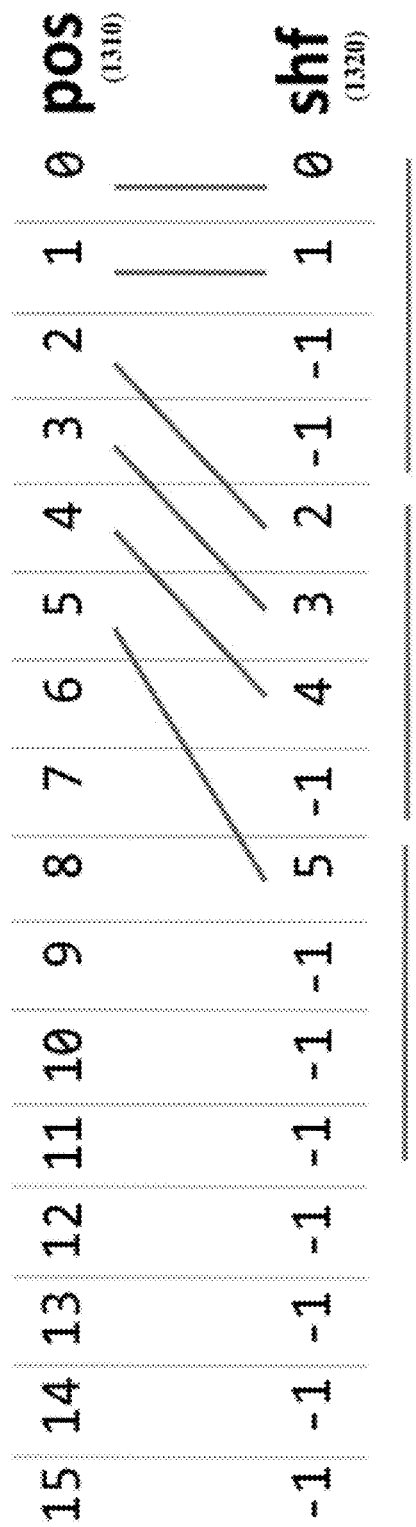
FIG. 13 illustrates how to construct a shuffle sequence that can be used in accordance with some embodiments.

In one embodiment, the operation of constructing a shuffle sequence 1320 with positions 1310 for a given descriptor is shown in FIG. 13. This is the same data represented in FIG. 6B. For this example, the descriptor byte contains 11001101, the output length is 3 4-byte integers. Since only 12 bytes of output are produced, the output of the second shuffle is not needed in this case. The length and shuffle sequence entries may be constructed for a table, one for each possible value of the descriptor byte. The following pseudocode shows one example of how each table entry may be created. This method may copy the byte positions (from 0 to 7) to the shuffle sequence, but each time it encounters a terminal (zero) bit in the descriptor, it may pad the shuffle sequence with enough –1s to complete the current output integer with leading (most-significant) zero bytes.

---

Construct the two shuffle sequences for a given table entry for the varint-G8IU decoder. We build a pair of adjacent 16-byte shuffle sequences as a single 32-byte sequence.

```
input  : descriptor byte value
output: pair of shuffle sequences, length
begin
    for i from 0 to 31 do
        shuffle-sequence[i] ← –1
    end
    bytes-remaining-in-integer ← 4
    source-pos ← 0
    shuffle-pos ← 0
    for i from 0 to 7 do
```

-continued

Construct the two shuffle sequences for a given table entry for the varint-G8IU decoder. We build a pair of adjacent 16-byte shuffle sequences as a single 32-byte sequence.

```
    shuffle-sequence[shuffle-pos] ← source-pos
    source-pos ← source-pos + 1
    shuffle-pos ← shuffle-pos + 1
    if bytes-remaining-in-integer > 0 then
        bytes-remaining-in-integer ← bytes-remaining-in-integer − 1
    end
    if ith bit of descriptor byte = 0 then
        shuffle-pos ← shuffle-pos + bytes-remaining-in-integer
        bytes-remaining-in-integer ← 4
    end
  end
  shuffle-sequence-1 ← shuffle-sequence[0..15]
  shuffle-sequence-2 ← shuffle-sequence[16..31]
  length ← number of zeros in descriptor byte
end
```

In some embodiments, table entries may be constructed for all possible byte values, but not all byte values may correspond to valid possible descriptors. While valid descriptors may not have more than three consecutive 1 bits (indicating an encoded integer 4 bytes in length), invalid descriptors may. In order to guard against this condition, the "bytes-remaining-in-integer >0" test may be utilized in the above pseudocode.

Embodiments that involve decoding the varint-G8CU format may involve additional complexity. For example, an integer that does not fit entirely into a data block may be partially written, with its remaining bytes stored in the succeeding data block. For this reason, embodiments with a table for this format used for lengths and shuffle sequences may contain different data in cases where different numbers of bytes carry over. The table can be viewed as having two dimensions, one indexed by the number of bytes written so far in a partially decoded integer, and the other indexed by the descriptor byte value. In addition, each table entry may contain not only the shuffle sequences and output length, but also the new value of the partial output byte count. Some embodiments may thus utilize a decoding method for one block of varint-G8CU as described in the following pseudo code.

Decodes 8 bytes stored in varint-G8CU format using two shuffles.

```
input : source-position, partial-output-count, destination-position
output: writes to destination, returns new destination-position and new
        partial-output-count
begin
    descriptor ← first byte of source data
    vector register ← next 16 bytes of source data
    shuffle-sequence-1 ← table[partial-output-count][descriptor].shuffle1
    shuffle-sequence-2 ← table[partial-output-count][descriptor].shuffle2
    length ← table[partial-output-count][descriptor].length
    partial-output-count ← table[partial-output-count][descriptor].partial-
    output
    shuffle vector register using shuffle-sequence-1
    write result from vector register to destination-position
    shuffle vector register using shuffle-sequence-2
    write result from vector register to destination-position + 16
    return { destination-position + length, partial-output-count }
end
```

Table construction for varint-G8CU may be similar to varint-G8IU, but the method may take into account the fact that a number of bytes (referred to here as partial-output-count) for a partially encoded integer may have already been written while decoding the previous block. This may be shown in the following pseudo code that may be utilized to construct shuffle sequences for a table that may be utilized for decoding some formats such as varint-G8CU for some embodiments. Because output may no longer be guaranteed to produce complete 32-bit integers, output position may need to be advanced in byte units rather than integers. The length computation in the following pseudocode may reflect this difference.

Construct the two shuffle sequences for a given table entry for the varint-G8CU decoder. We build a pair of adjacent 16-byte shuffle sequences as a single 32-byte sequence.

```
input : descriptor byte value, old-partial-output-count
output: pair of shuffle sequences, length, new-partial-output-count
begin
    for i from 0 to 31 do
        shuffle-sequence[i] ← −1
    end
    bytes-remaining-in-integer ← 4 − old-partial-output-count
    source-pos ← 0
    shuffle-pos ← 0
    for i from 0 to 7 do
        shuffle-sequence[shuffle-pos] ← source-pos
        source-pos ← source-pos + 1
        shuffle-pos ← shuffle-pos + 1
        if bytes-remaining-in-integer > 0 then
            bytes-remaining-in-integer ← bytes-remaining-in-integer − 1
        end
        if ith bit of descriptor byte = 0 then
            shuffle-pos ← shuffle-pos + bytes-remaining-in-integer
            bytes-remaining-in-integer ← 4
        end
    end
    shuffle-sequence-1 ← shuffle-sequence[0..15]
    shuffle-sequence-2 ← shuffle-sequence[16..31]
    new-partial-output-count ← number of leading 1 bits in descriptor byte
    length ← (4 * zeros in descriptor byte + new-partial-output-count) −
             old-partial-output-count
end
```

While the above provides several different examples of decoding methods and table construction methods for group formats in accordance with various embodiments, other methods for decoding and table construction may be utilized with in the scope of this disclosure.

Furthermore, the above decoding and/or table construction methods may be utilized by other embodiments that may utilize a parallel shuffle operation and/or a table for decoding other encoding formats, such as a split unary, a split binary, a packed unary, and/or a packed unary format.

In one embodiment, a method for decoding a split unary format may be provided. Embodiments may utilize a parallel method that may utilize SIMD instructions for decoding this format. Some embodiments may operate on a block of bytes, such as 8 bytes for example, of encoded data at a time. The encoded data may be encoded according to a split unary encoding format. The descriptor bits, which may be continuation bits or termination bits, found in each byte may be extracted or collected in parallel. In some embodiments, this collection process may utilize a SIMD instruction such as PMOVMSKB instruction. For example, a PMOVMSKB instruction may extract the most significant bits from a collection of bytes. Other parallel instructions may also be utilized to collect or extract these bits. The extracted bits, which may be referred to as a descriptor, may be used as an offset into a table of precomputed shuffle sequences. A parallel permutation instruction, such as PSHUFB, using the shuffle sequence may be used to determine how to decode the data. In some embodiments, a series of bit shift operations may be applied to remove or sanitize the original continuation and/or termination bits from the decoded data. A similar method for decoding using a table and a shuffle operation may be utilized for split binary encoded format. Some embodiments may achieve a similar result using an individual step, even in case where a change in byte order occurs. This process may involve pre-computing a shuffle sequence that composes two permutations, where one permutation decodes the format and another permutation changes the byte order.

In some embodiments, methods for constructing tables for a group unary format such as varint-G8IU as discussed above may be utilized to decode a split unary encoded data using a shuffle instruction such as PSHUFB.

Figure 14:
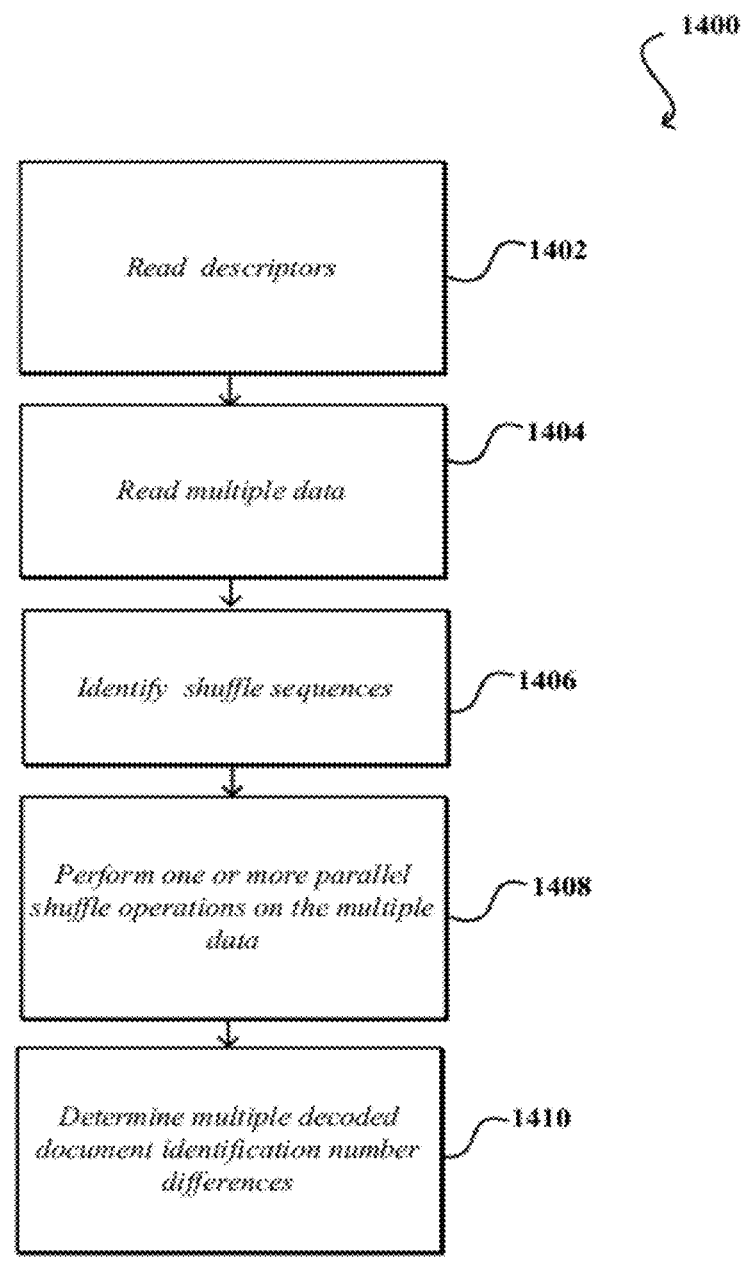
FIG. 14 illustrates a method for decoding encoded document identification numbers differences in a search engine posting list that can be used in accordance with some embodiments.

FIG. 14 provides a computer-implemented method 1400 for decoding encoded document identification number differences in a search engine posting list in accordance with various embodiments. Method 1400 may be implemented in environments and devices as seen in environment 100 of FIG. 1, for example. Method 1400 may also include and/or utilize aspects of decoding group formats as discussed above, including group formats as described at least with respect to FIGS. 5A-C, 6A-C and/or 7A-C. Under control of one or more computer systems configured with executable instructions, method 1400 includes reading one or more descriptors 1402. Each descriptor includes size information regarding a group of encoded document identification number differences. In some embodiments, encoded document identification number differences are encoded with a group unary format. Multiple data representing the group of encoded document identification number differences are read 1404, where the group of encoded document identification number differences is linked with the one or more descriptors. One or more shuffle sequences linked with the one or more descriptors from a lookup table are identified 1406. One or more parallel shuffle operations are performed on the multiple data representing the group of encoded document identification number differences using the identified shuffle sequences 1408. The one or more parallel shuffle operations include inserting one or more sequences of zeros into the multiple data. Multiple decoded document identification number differences from the shuffled multiple data representing the group of encoded document identification number differences are determined 1410.

Figure 15:
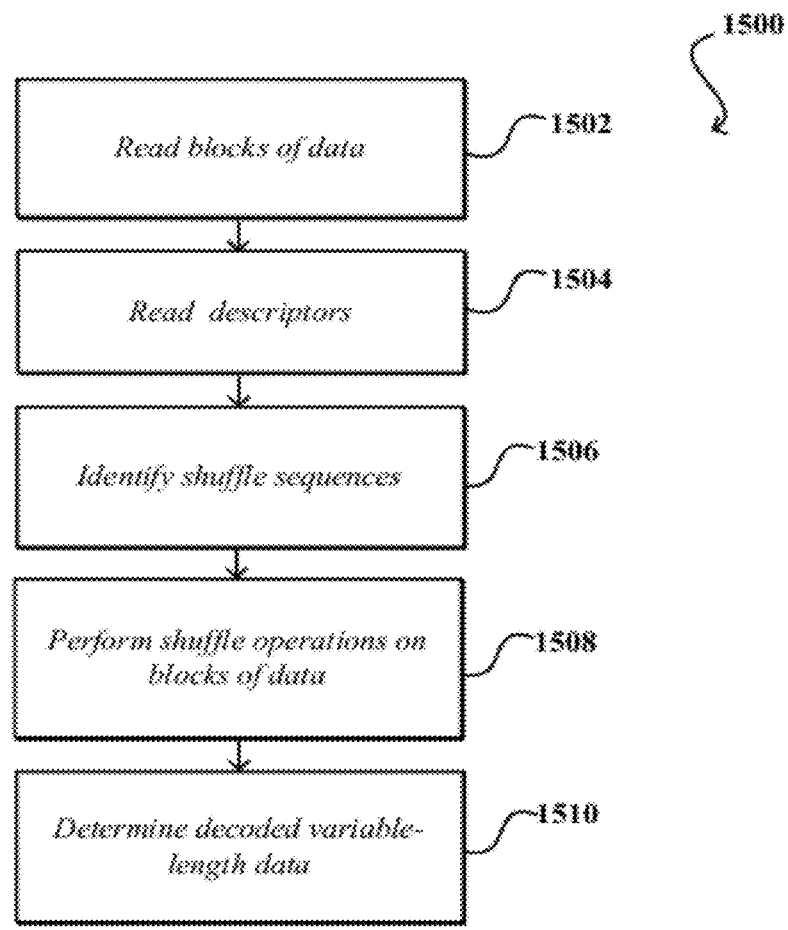
FIG. 15 illustrates a method for decoding variable-length data that can be used in accordance with some embodiments.

FIG. 15 provides a computer-implemented method 1500 for decoding variable-length data in accordance with various embodiments. Method 1500 may be implemented in environments and devices as seen in environment 100 of FIG. 1, for example. Method 1500 may also include and/or utilize aspects of decoding group formats as discussed above, including group formats as described at least with respect to FIGS. 5A-C, 6A-C and/or 7A-C, and/or method 1400 of FIG. 14. Under control of one or more computer systems configured with executable instructions, method 1500 includes reading one or more blocks of data 1502. Each block of data represents multiple encoded variable-length data. One or more descriptors linked with the one or more blocks of data are read 1504. One or more shuffle sequences linked with the one or more descriptors are identified from a lookup table 1506. One or more shuffle operations are performed on the one or more blocks of data using the one or more identified shuffle sequences 1508. Multiple decoded variable-length data are determined from the shuffled one or more blocks of data 1510.

In some embodiments, performing the one or more shuffle operations includes inserting one or more sequences of zeros into the shuffled one or more blocks of data to represent one or more portions of the one or more blocks of data in a standard format, such as a 32-bit representation of an integer. The one or more data blocks may represent multiple variable-length integers. In some embodiments, the one or more data blocks may represent other variable-length data.

Determining the multiple decoded variable-length data from the shuffled one or more blocks of data may also include determining a partial result from the shuffled one or more blocks of data. A remaining portion associated with the partial result may be determined from another block of data. Such embodiments may utilize complete block variations as discussed above. In some cases, the one or more shuffle operations may include one or more parallel shuffle instructions from a single instruction multiple data (SIMD) processor instruction set.

Some embodiments may include identifying one or more offsets linked with the one or more descriptors. The one or more offsets linked with the one or more descriptors may include an input offset with a fixed size; in some cases, the one or more offsets linked with the one or more descriptors may include an output offset with a variable size The fixed size may depend on a number of bytes included in one or more blocks of data and the one or more descriptors. The one or more offsets linked with the one or more descriptors may include an input offset with a variable size. The variable size may depend on a number of data represented by the block of data. Some embodiments may also include identifying other output offsets.

Embodiments that involve packed formats, such as packed unary or packed binary, may also utilize decoding methods that share some similarities with those discussed above. Embodiments that involve decoding packed formats may include precomputing tables that are used for masking and shifting the bits of the encoded format. In some embodiments that utilize the packed binary format for example, the low order two bits of the first byte can indicate how many bytes may be needed to encode an integer. A method for decoding such a packed binary format may include the following steps. A group of bytes, which may be four in some cases, may be read into contiguous memory. The first byte of the read data may be used to look up in a table of masks. The result may be shifted to the right 2 bits to eliminate the descriptor. A mask may be applied to determine which bytes to keep and output the result. An input pointer may be moved by the amount by the descriptor.

Embodiments that may decode packed formats may avoid conditionals or loops. In some embodiments, shift and mask may be combined into the same statement that writes to the output; this may avoid the need to save a copy of the descriptor. In some embodiments, the masks may just have 1-bits all the way across the bytes that may be wanted, and 0-bits across the bytes that are not wanted.

A similar method may be utilized in some embodiments to decode packed unary formats. In some embodiments, instead of shifting 2 bits as in the case of packed binary formats, embodiments may shift different amounts according to a table.

Some embodiments may utilize additional auxiliary encoding methods as discussed next. These may be referred to as hybrid encodings or formats. In these hybrid formats, a marker may be used to indicate whether the base form of encoding is used, or a more compressed alternate form.

In some embodiments, a variation of the variable length encoding formats is provided that includes a hybrid of a given compression scheme and a bit vector to save space. In some embodiments, the variable length encoding format may include a group unary format. Embodiments may include detecting if every member of a sequence of upcoming integers or data to be encoded are very small, such that more than one of the integers or data may be encoded into one byte.

These integers or data may be stored as a bit vector. For example, the nth bit may represent whether a document at position base+n is in a posting list. A special descriptor value may indicate whether the group of data bytes should be interpreted as using the one of the variable-length integer formats, or as a bit vector.

Embodiments that utilize a bit vector may store data regarding small integers or data in a unary format or sequence. Unary sequences may represent a sequence of small values a, b, c, . . . by concatenating the unary representations of a−1, b−1, c−1 . . . separated by zeros. Such sequences may be preceded by a byte indicating the length of the sequence representation in bytes. Merely by way of example, runs of integers less than 8 may be packed into unary sequences. A unary sequence may be used when the encoded values for two or more integers fit into a single byte, i.e., their sum is less than or equal to 8. This may guarantee that this form of encoding uses no more space than the corresponding variable length representation from one of the other formats discussed above.

Figure 16:
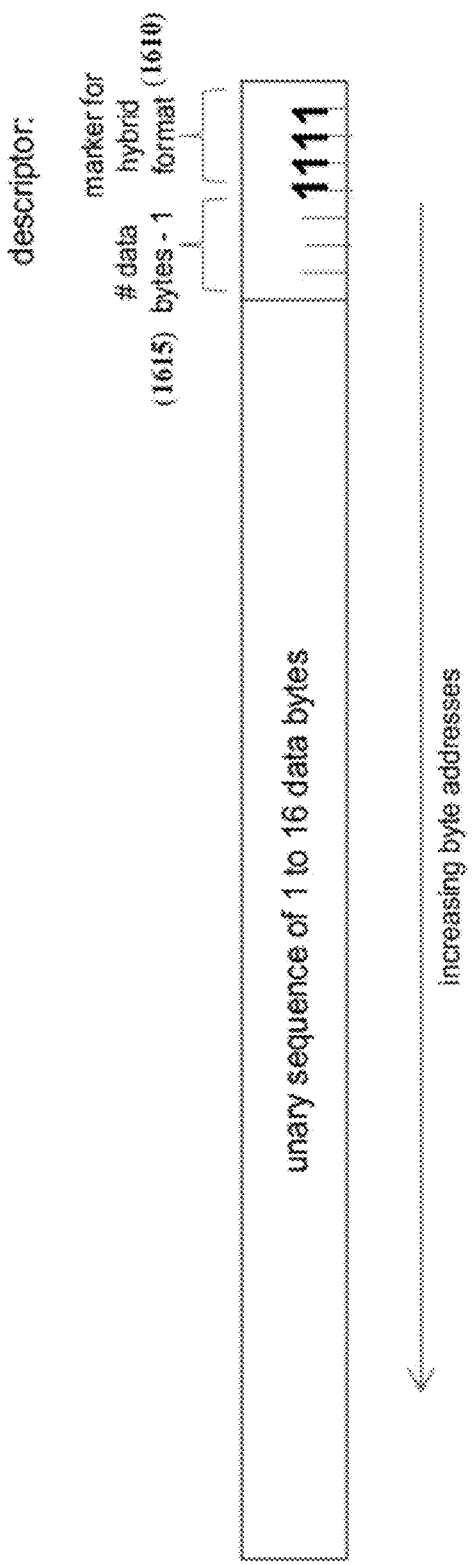
FIG. 16 illustrates a hybrid unary sequence encoding format that can be used in accordance with some embodiments.

For example, the following hybrid unary sequence methods may be applied to group unary formats including G8IU and G8CU. At each block boundary, one can potentially switch to an alternate encoding in which a sequence of small numbers, which may be delta-gaps in some cases, is encoded as a sequence of unary numbers. The low-order four bits of the descriptor may be used as the marker 1610, as shown in FIG. 16. For example, if their value is 1111, which would not occur in a valid G8IU or G8CU descriptor, it can indicate that the data bytes are encoded using the alternate compressed form. Other markers may be utilized in some cases to indicate that an alternate compressed form is being used. In this example, the high-order four bits 1615 of the descriptor represent one less than the length in bytes of the unary sequence representation.

Different conditions may be used to determine when to switch from the base to the alternate compressed format. In one embodiment, the encoder looks at the next two integers to be encoded. If the next two integers both would fit into one byte using a unary representation, then a unary sequence starting with those values can be created, and can continues until either the maximum byte length (16) is reached, or until the unary representation of the next delta-gap would exceed 8, the size of one byte in bits. If the two integers would not fit into one byte using a unary representation, then the base encoding (such as G8IU or G8CU, for example) is used for this block.

Figure 17:
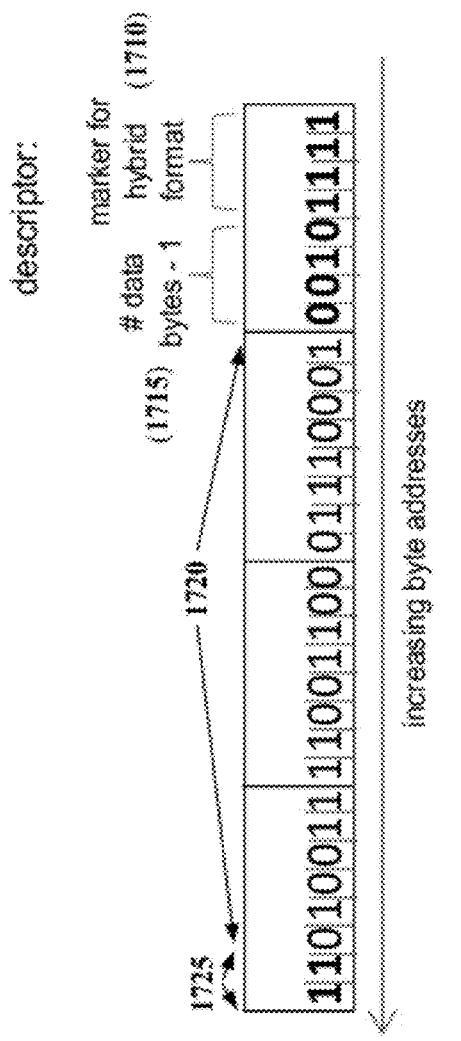
FIG. 17 illustrates an example of data encoded with a hybrid unary sequence encoding format in accordance with some embodiments.

For example, suppose the next sequence of values to be encoded is: 2,1,1,4,1,1,3,1,5,1,2,9. The unary encoding of the first two values would be 01 and 0. Since the concatenated values occupy less than a byte, a compressed unary sequence could be used. Each unary value is concatenated until the value 9 is reached, which cannot be represented in one byte in unary. The values prior to the 9 can be stored as one unary sequence, which is shown in FIG. 17. The sequence occupies 22 bits 1720, which require 3 bytes of storage. A marker 1710 of 1111 is used to indicate a hybrid format is being used. The high order bits 1715 in the descriptor can be set to 0010, which is one less than 3 in binary. If additional bits are left in the final byte, they are set to 1 1725; high-order 1s in the final byte of the sequence are always ignored on decoding, since they represent an unterminated unary value.

In some embodiments, a variation of the variable length encoding formats is provided that includes a hybrid of a given compression scheme and run-length encoding to save space. In some embodiments, the variable length encoding format may include a group unary format. Embodiments may encode a run of similar data, such as a run of all 1s, by storing the length of the run instead of the values themselves. Merely by way of example, longs runs of the value 1 may occur frequently in some indices. In the context of some product searches, the repetition may be found because of the repetition of a common word, such as a product type or name. Embodiments may include several different run-length encodings. Some embodiments may include a run with constant-length descriptor. These embodiments may include runs of length between 3 and 258 that may be encoded in a single byte representing length −3. Some embodiments may include a run with variable-length descriptor. These embodiments may include runs of length between 3 and 2^28+2 that may be encoded using a split unary format as discussed above. Some embodiments may include a run of blocks with a constant-length descriptor. These embodiments may include runs of length 8m for m in [1,16] that may be encoded in 4 bits with the binary value m−1. Some embodiments may utilize run-length encoding when the runs of 1 are of length at least 3. This may ensure that the run-length encoding uses no more space than a corresponding variable length representation.

The following provides an example of a hybrid encoding with runs of blocks with constant length descriptor (RBC). This example may be applied to group unary formats, including G8IU and G8CU.

For example, if a particular value is very common in the data, it is possible to achieve high compression by looking for consecutive runs of that value, and storing just the length of the run. In some applications, the value 1 is very common, so the following will specifically represent runs of 1s in this fashion. Of course, runs of other constants could be encoded in a similar way. In order to save space, blocks of b consecutive 1s can be counted, where b is the granularity of the counter. For the following examples, b will equal 8, though other values of b can clearly be used.

Figure 18:
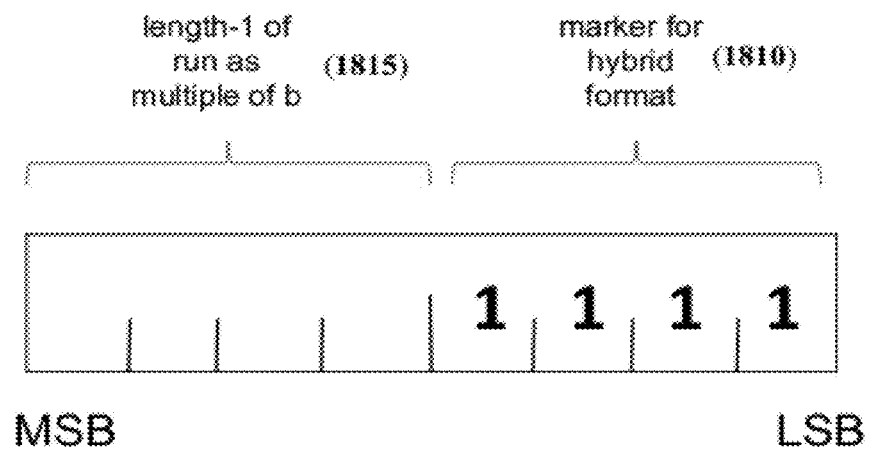
FIG. 18 illustrates a hybrid encoding format with run of blocks with constant-length descriptor that can be used in accordance with some embodiments.

As discussed above, at each block boundary, one can potentially switch to an alternate encoding in which a run of consecutive 1s is represented by a count indicating the length of the run. The low-order four bits of the descriptor can used as the marker. For example, as shown in FIG. 18, a marker 1810, represented as 1111 in this example, which would not occur in a valid G8IU or G8CU descriptor, may be utilize to indicate that the high order bits of the descriptor represent the run length as follows. If the binary value of the high order 4 bits 1815 is v, the length of the run is b*(v+1). This allows the representation of a run whose length is any multiple of b between b and 16b.

A compressed RBC encoding may be utilized whenever an upcoming run of b or more 1s is seen, for example. The RBC sequence can terminate either when 128 values have been encoded, or when the run of 1s ends. If the length of an upcoming run of 1s is not a multiple of b, the largest multiple not exceeding the length of the run can be used, and the remaining values are stored in the next block using the regular base encoding (together with whatever other upcoming values are to be stored in that block). This representation is extremely compact; it does not require any data bytes; all the information is in the descriptor byte.

Figure 19:
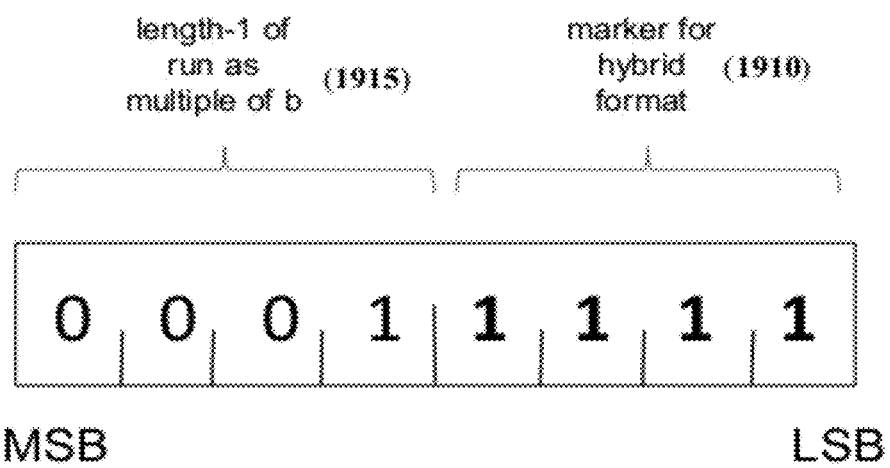
FIG. 19 illustrates an example of data encoded with a hybrid encoding format with run of blocks with constant-length descriptor in accordance with some embodiments.

For example, suppose the next values in the sequence are 1,1,1,1,1,1,1,1,1,1,1,1,1,1,1,1,1,1,1,5. Since b=8 and there are at least 8 ones, a run-length-encoded sequence can be constructed. The number of ones in the run is 19, which is 2*8+3. The nearest multiple of 8 is 16, so the RBC representation for just those 16 can be used. The "2" represents the number of groups 8; the value 2−1=1 can be stored, as shown in FIG. 19 at reference number 1915. And again, a marker 1910, represented as 1111 in this example, is also utilized.

Some embodiments may include a hybrid encoding scheme with run with constant length descriptor (RC). This method applies primarily to split unary format (varint-SU), but could also be combined with group unary or packed unary. The following provides a description of an implementation with split unary, though it may be modified to apply to the other unary formats.

Figure 20:
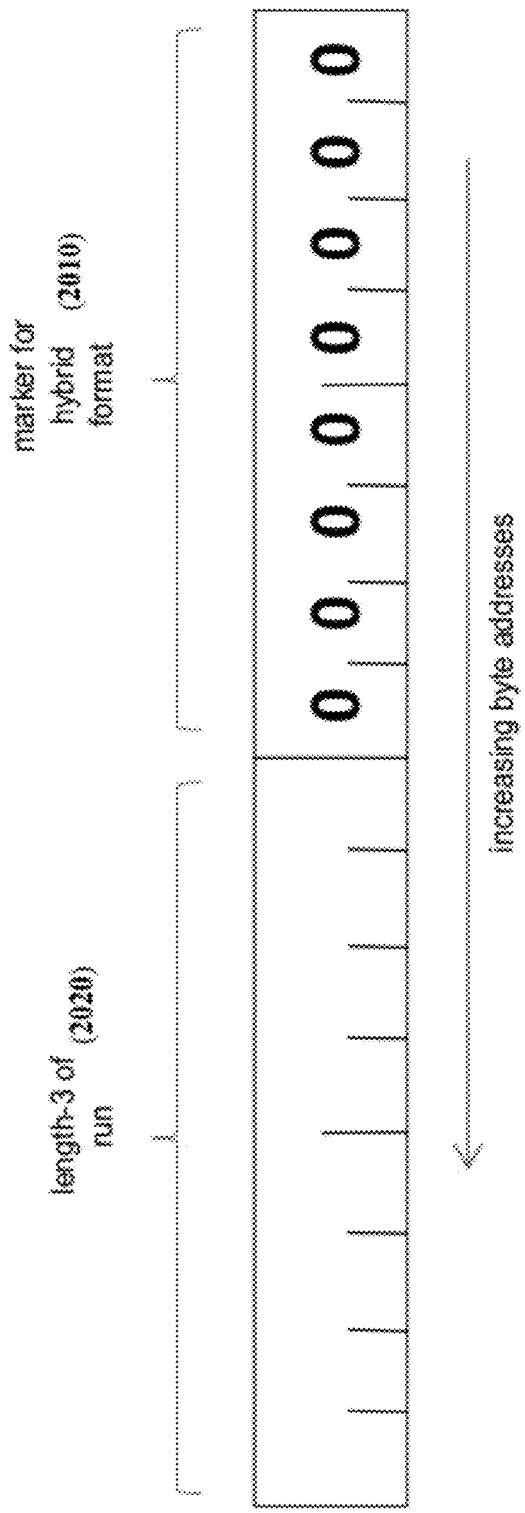
FIG. 20 illustrates a hybrid encoding format with run with constant-length descriptor that can be used in accordance with some embodiments.

As discussed above, runs of a constant value may be represented by their length. However, for this example, a separate descriptor byte is not utilized in the SU format. Therefore, a value zero may be utilized as a marker 2010 as shown in FIG. 20; this may require that the value zero does not occur in the input (which is the case for delta-gaps in a posting list, for example). Each byte in the encoded representation may either be the initial byte in a varint-SU-encoded integer, or the value zero which is the marker for the RC format. If the value is nonzero, this byte can be the first in a normal SU-encoded integer. If the value is zero, the next byte can be used to store the run length information. Specifically, for a run of length r>2, the binary value of r−3 is stored in the byte, as shown at reference number 2020. This allows encodings of runs of length from 3 to 258.

To determine when to use the RC format, the upcoming sequence of values can be examined. If at least the next three values are 1s, the entire run of 1s (up to 258) can be encoded in the compressed form. Otherwise, the next value in SU format can be stored. The threshold on the minimum length needed to switch to RC format need not be 3; 3 is the minimum threshold that insures that the encoding is more compact than varint-SU.

Figure 21:
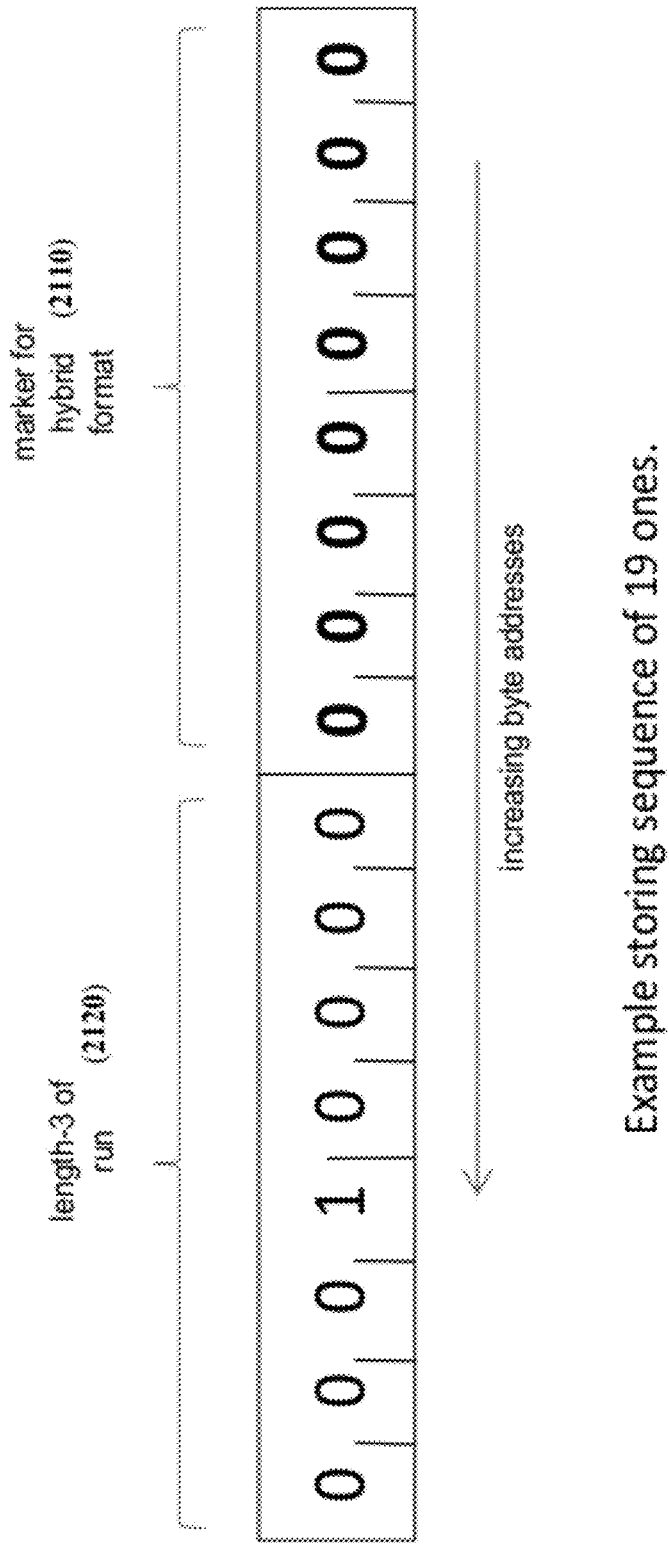
FIG. 21 illustrates an example of data encoded with a hybrid encoding format with run with constant-length descriptor in accordance with some embodiments.

For example, suppose the next values in the sequence are 1,1,1,1,1,1,1,1,1,1,1,1,1,1,1,1,1,1,1,5. FIG. 21 shows an example of storing this sequence of ones in the RC format. Since the sequence starts with at least three 1s, the entire sequence of ones can be encoded in RC format. This means storing zeros in the first byte 2110, and the run length of 19, minus 3, in the second byte 2120. The 5 after the run can be stored in the base varint-SU format.

Some embodiments may include a hybrid encoding method with run with variable length descriptor (RV). This method applies primarily to split unary format (varint-SU), but could also be combined with group unary or packed unary.

Figure 22:
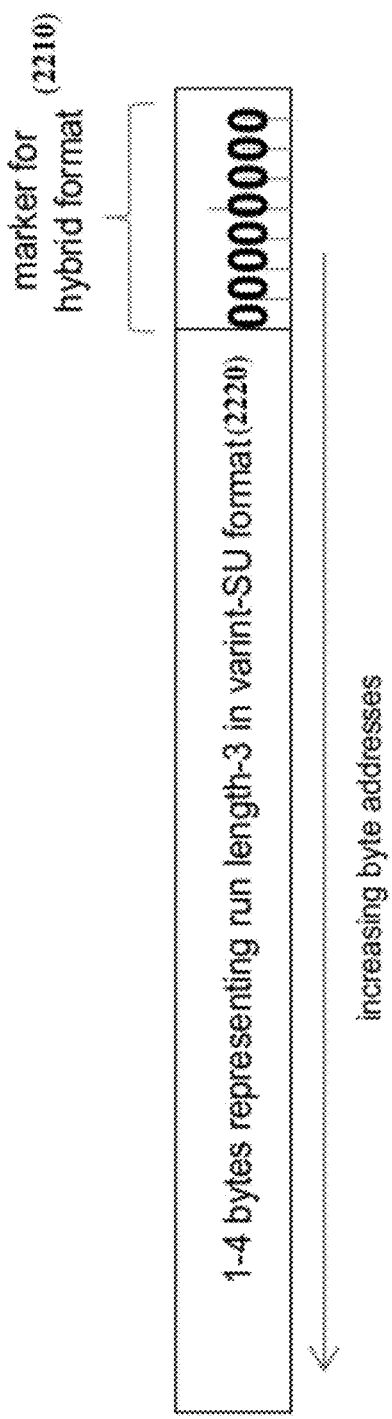
FIG. 22 illustrates a hybrid encoding format with run with variable-length descriptor that can be used in accordance with some embodiments.

As discussed above, runs of a constant value can be represented by their length and use the value zero in the first byte as a marker 2210 as seen in FIG. 22; this may require that the value zero does not occur in the input (which is the case for delta-gaps in a posting list, for example). Each byte in the encoded representation may either be the initial byte in a varint-SU-encoded integer, or the value zero which is the marker for the RV format. If the value is nonzero, this byte can be the first in a normal SU-encoded integer. If the value is zero, the next 1-4 bytes 2220 can be used to store the run length information in varint-SU format. The length of the run is stored, not the values themselves. Again, for a run of length r>2, the binary value of r−3 can be stored in the encoded representation. Because varint-SU can store integers up to $2^{28}-1$ in four bytes, this allows encodings of runs of length from 3 to $2^{28}+2$.

The criteria for deciding whether to use the RV format can be the same as for the RC format: The upcoming sequence of values can be examined. If at least the next three values are 1s, the entire run of 1s (up to $2^{28}+2$) can be encoded in the compressed form. Otherwise, the next value can be stored in SU format. The threshold on the minimum length needed to switch to RV format need not be 3; 3 is the minimum threshold that insures that the encoding is more compact than varint-SU.

Figure 23:
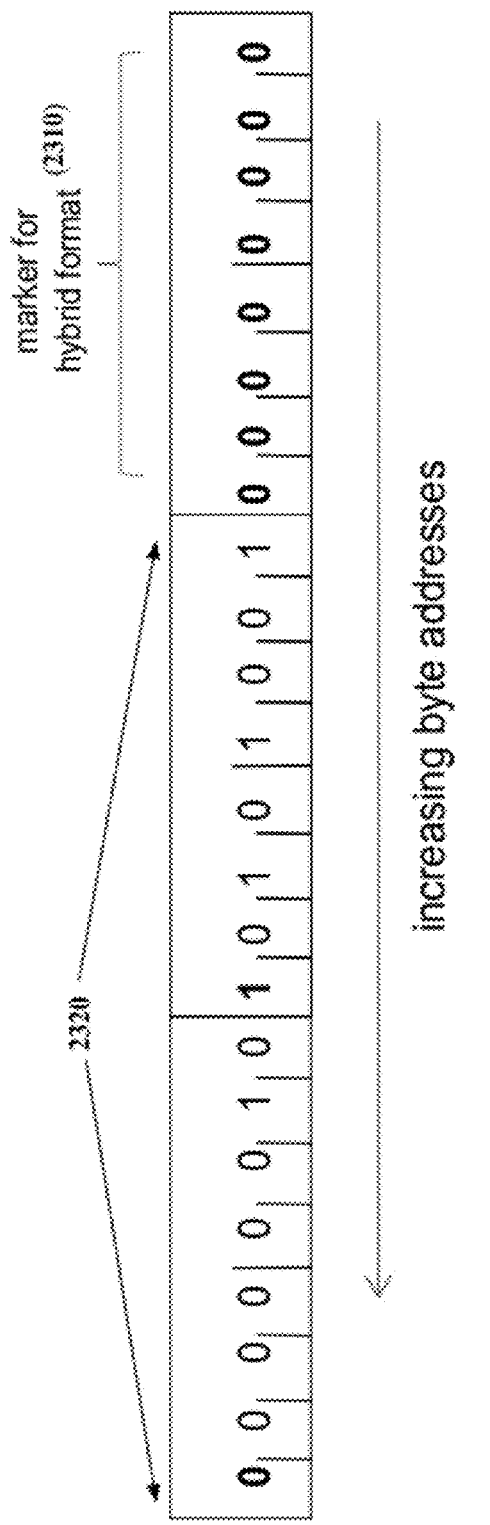
FIG. 23 illustrates an example of data encoded with a hybrid encoding format with run with variable-length descriptor in accordance with some embodiments.

For example, suppose the next values in the sequence are 300 ones followed by a different number. Since the sequence starts with at least three 1s, the entire sequence can be encoded in RV format. This means storing zero in the first byte, and the run length of 300, minus 3, in varint-SU form. FIG. 23 shows an example of storing 300 ones in the RV format. The right most byte represents the marker byte 2310 and the $2^{nd}$ and $3^{rd}$ bytes to the left 2320 represent the quantity 297 in varint-SU format.

As discussed above, the various embodiments can be implemented in a wide variety of operating environments, which in some cases can include one or more user computers, computing devices, or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Various aspects also can be implemented as part of at least one service or Web service, such as may be part of a service-oriented architecture. Services such as Web services can communicate using any appropriate type of messaging, such as by using messages in extensible markup language (XML) format and exchanged using an appropriate protocol such as SOAP (derived from the "Simple Object Access Protocol"). Processes provided or executed by such services can be written in any appropriate language, such as the Web Services Description Language (WSDL). Using a language such as WSDL allows for functionality such as the automated generation of client-side code in various SOAP frameworks.

Most embodiments utilize at least one network that would be familiar to those skilled in the art for supporting communications using any of a variety of commercially-available protocols, such as TCP/IP, OSI, FTP, UPnP, NFS, CIFS, and AppleTalk. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including HTTP servers, FTP servers, CGI servers, data servers, Java servers, and business application servers. The server(s) also may be capable of executing programs or scripts in response requests from user devices, such as by executing one or more Web applications that may be implemented as one or more scripts or programs written in any programming language, such as Java®, C, C# or C++, or any scripting language, such as Perl, Python, or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices, or any other medium which can be used to store the desired information and which can be accessed by the a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A computer-implemented method for decoding encoded differences between document identification numbers in a search engine posting list comprising:
    under control of one or more computer systems configured with executable instructions,
        reading one or more descriptors, each descriptor including information regarding a plurality of size information for a group of encoded differences between document identification numbers for the search engine posting list and encoded in at least one of a packed unary or a group unary format;
        reading data representing the group of encoded differences between document identification numbers linked with the one or more descriptors;
        identifying one or more shuffle sequences linked with the one or more descriptors from a lookup table;
        generating shuffled data by performing one or more shuffle operations in parallel on the data representing the group of encoded differences between document identification numbers using the one or more shuffle sequences, wherein the one or more shuffle operations include inserting one or more sequences of zeros into the data; and
        determining a plurality of decoded differences between document identification numbers from the shuffled data.

2. A computer-implemented method for decoding variable-length data comprising:
    under control of one or more computer systems configured with executable instructions,
        reading one or more blocks of data, each block of data including a plurality of encoded variable-length data, each of the plurality of encoded variable-length data representing a difference between document identification numbers and encoded in at least one of a packed unary or a group unary format;
        reading one or more descriptors linked with the one or more blocks of data, each descriptor including size information for the one or more blocks of data;
        identifying one or more shuffle sequences linked with the one or more descriptors from a lookup table;
        generating shuffled data by performing one or more shuffle operations in parallel on the one or more blocks of data using the one or more shuffle sequences;
        inserting one or more sequences of zeros into the one or more blocks of data to represent one or more portions of the one or more blocks of data in a standard format; and
        determining a plurality of decoded variable-length data from the shuffled data.

3. The computer-implemented method for decoding variable-length data of claim 2 wherein the one or more blocks of data represent a plurality of variable-length integers.

4. The computer-implemented method for decoding variable-length data of claim 2 wherein determining the plurality of decoded variable-length data from the shuffled data comprises:
    determining a partial result from the one or more blocks of data,
    wherein a remaining portion associated with the partial result is determined from another block of data.

5. The computer-implemented method for decoding variable-length data of claim 2 wherein the one or more shuffle operations comprise one or more parallel shuffle instructions from a single instruction multiple data (SIMD) processor instruction set.

6. The computer-implemented method for decoding variable-length data of claim 2 further comprising:
    identifying one or more offsets linked with the one or more descriptors.

7. The computer-implemented method for decoding variable-length data of claim 6 wherein the one or more offsets linked with the one or more descriptors comprise an input offset with a fixed size and an output offset of a variable size.

8. The computer-implemented method for decoding variable-length data of claim 6 wherein the one or more offsets linked with the one or more descriptors comprise an input offset with a variable size.

9. A system for decoding variable-length data comprising, comprising:
   a processor; and
   a memory device including instructions that, when executed by the processor, cause the system to:
      read one or more blocks of data, each block of data including a plurality of encoded variable-length data, each of the plurality of encoded variable-length data representing a difference between document identification numbers and encoded in at least one of a packed unary or a group unary format;
      read one or more descriptors linked with the one or more blocks of data, each descriptor including size information for the one or more blocks of data;
      identify one or more shuffle sequences linked with the one or more descriptors from a lookup table;
      generate shuffled data by performing one or more shuffle operations in parallel on the one or more blocks of data using the one or more shuffle sequences;
      insert one or more sequences of zeros into the shuffled data to represent one or more portions of the one or more blocks of data in a standard format; and
      determine a plurality of decoded variable-length data from the shuffled data.

10. The system for decoding variable-length data of claim 9 wherein the one or more blocks of data represent a plurality of variable-length integers.

11. The system for decoding variable-length data of claim 9 wherein the instructions, when executed, to cause the system to determine the plurality of decoded variable-length data from the shuffled data include causing the system to:
   determine a partial result from the shuffled data,
   wherein a remaining portion associated with the partial result is determined from another block of data.

12. The system for decoding variable-length data of claim 9 wherein the one or more shuffle operations comprise one or more parallel shuffle instructions from a single instruction multiple data (SIMD) processor instruction set.

13. The system for decoding variable-length data of claim 9 wherein the instructions, when executed, further cause the system to:
   identify one or more offsets linked with the one or more descriptors.

14. The system for decoding variable-length data of claim 13 wherein the one or more offsets linked with the one or more descriptors include an input offset with a fixed size and an output offset of variable size.

15. The system for decoding variable-length data of claim 13 wherein the one or more offsets linked with the one or more blocks of data comprise an input offset with a variable size.

16. A non-transitory computer readable storage medium storing instructions for decoding variable-length data comprising, the instructions when executed by a processor causing the processor to:
   read one or more blocks of data, each block of data including a plurality of encoded variable-length data, each of the plurality of encoded variable-length data representing a difference between document identification numbers and encoded in at least one of a packed unary or a group unary format;
   read one or more descriptors linked with the one or more blocks of data, each descriptor including size for information for the one or more blocks of data;
   identify one or more shuffle sequences linked with the one or more descriptors from a lookup table;
   generate shuffled data by performing one or more shuffle operations in parallel on the one or more blocks of data using the one or more shuffle sequences;
   insert one or more sequences of zeros into the shuffled data to represent one or more portions of the one or more blocks of data in a standard format; and
   determine a plurality of decoded variable-length data from the shuffled data.

17. The non-transitory computer readable storage medium of claim 16 wherein the one or more blocks of data represent a plurality of variable-length integers.

18. The non-transitory computer readable storage medium of claim 16 wherein the instructions, when executed, to cause the processor to determine the plurality of decoded variable-length data from the shuffled data include causing the processor to:
   determine a partial result from the shuffled data,
   wherein a remaining portion associated with the partial result is determined from another block of data.

19. The non-transitory computer readable storage medium of claim 16 wherein the one or more shuffle operations comprises one or more parallel shuffle instructions from a single instruction multiple data (SIMD) processor instruction set.

20. The non-transitory computer readable storage medium of claim 16 wherein the instructions, when executed, further cause the processor to:
   identify one or more offsets linked with the one or more descriptors,
   wherein the one or more offsets linked with the one or more descriptors comprise an input offset with a fixed size and an output offset with a variable size.

21. The non-transitory computer readable storage medium of claim 16 wherein the instructions, when executed, further cause the processor to:
   identify one or more offsets linked with the one or more descriptors, wherein the one or more offsets linked with the one or more descriptors comprise an input offset with a variable size.

* * * * *